US012274041B2

(12) United States Patent
Son et al.

(10) Patent No.: US 12,274,041 B2
(45) Date of Patent: Apr. 8, 2025

(54) DISPLAY PANEL

(71) Applicant: LG Display Co., Ltd., Seoul (KR)

(72) Inventors: Jiho Son, Paju-si (KR); Geonhyeong Kim, Paju-si (KR); Hoyoon Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 223 days.

(21) Appl. No.: 18/065,415

(22) Filed: Dec. 13, 2022

(65) Prior Publication Data

US 2023/0209792 A1    Jun. 29, 2023

(30) Foreign Application Priority Data

Dec. 27, 2021    (KR) .................. 10-2021-0187965

(51) Int. Cl.
*H05K 9/00* (2006.01)
*H05K 5/03* (2006.01)
*H10K 50/84* (2023.01)
*H10K 59/12* (2023.01)

(52) U.S. Cl.
CPC .............. *H05K 9/0067* (2013.01); *H05K 5/03* (2013.01); *H10K 50/841* (2023.02); *H10K 59/12* (2023.02)

(58) Field of Classification Search
CPC ........ H05K 5/03; H05K 7/20954; H05K 1/11; H05K 1/14; H05K 9/00; H10K 59/12; H10K 59/8721; H10K 59/873; H10K 59/131; G02F 1/29; G02F 1/167; G02F 1/1368; G02F 1/1345; G02F 1/1333

USPC .......... 361/752, 807–810, 749; 349/149–151
See application file for complete search history.

(56) References Cited

U.S. PATENT DOCUMENTS

| 10,228,604 | B1 * | 3/2019 | Ghali ................. G02F 1/13454 |
| 2012/0176760 | A1 * | 7/2012 | Cohen .................. H04M 1/026 361/807 |
| 2015/0014141 | A1 * | 1/2015 | Rao ........................ G06V 40/63 200/600 |
| 2019/0071584 | A1 * | 3/2019 | Kim ......................... B32B 3/26 |
| 2019/0317621 | A1 * | 10/2019 | Lee ..................... G06F 3/04142 |
| 2021/0168230 | A1 * | 6/2021 | Baker .................... G06F 1/1698 |

FOREIGN PATENT DOCUMENTS

| KR | 20200054415 A | 5/2020 |
| KR | 10-2021-0030145 A | 3/2021 |
| KR | 20210083970 A | 7/2021 |

* cited by examiner

*Primary Examiner* — Tuan T Dinh
(74) *Attorney, Agent, or Firm* — Seed IP Law Group LLP

(57) ABSTRACT

A display panel includes a cover window, an ink layer formed with a multi-layer structure on a rear surface of the cover window and directly adhered to a middle frame, and an adhesive layer disposed on the rear surface of the cover window and overlapping with the ink layer, and at least one layer of the multi-layer structure of the ink layer includes a conductive material. An electric charge generated by the cover window is distributed to the middle frame via the ink layer and discharged by the middle frame to prevent a shift phenomenon, a green phenomenon, or both in the display panel.

24 Claims, 19 Drawing Sheets

DISPLAY PANEL

CROSS REFERENCE TO RELATED APPLICATION

The present application claims priority to Korea Patent Application No. 10-2021-0187965, filed Dec. 27, 2021, the entire contents of which are incorporated herein by reference for all purposes.

BACKGROUND

Technical Field

The present disclosure relates to a display panel, and more particularly, but not exclusively, to a display panel where an ink layer with a multi-layer structure including a conductive material is disposed below a cover window, and a middle frame and a black matrix are coupled directly thereto.

Description of the Related Art

Examples of conventional display devices include a liquid crystal display (LCD), a field emission display device (FED), an electrowetting display device (EWD) and an organic light emitting display device (OLED).

Such a display device may include a cover window that protects a display panel of the display device from external shocks. However, have a number of disadvantages, including that an electric charge generated by friction between the cover window and an external object, or that is generated from the outside accumulates in the cover window. In addition, the electric charge may transfer from a side of the display panel to a panel layer inside the display panel. The transfer of the electric charge may cause a shift phenomenon in the panel layer that shifts a threshold voltage of a driving thin film transistor mounted inside a display layer.

If the threshold voltage of the driving thin film transistor is shifted higher by the shift phenomenon, as above, the display panel emits light by a voltage that is higher than intended. As a result, a "green" phenomenon occurs where an end or a side area of the display panel emits light brighter than other areas, deteriorates the image quality. Such brighter areas may appear as a "greenish" color to a user. Alternatively, if a threshold voltage of the driving thin film transistor is decreased by the shift phenomenon, the display panel emits light by a signal lower than an intended emission signal. Such a scenario may also cause the green phenomenon described above, where a portion of the display panel emits a brighter light than other areas and results in a deteriorated image quality.

BRIEF SUMMARY

In an embodiment of the disclosure, a display device prevents occurrence of the shift phenomenon of a thin film transistor, and the resulting green phenomenon, by preventing an electric charge generated by friction and the like in a cover window from penetrating into a display panel.

In some non-limiting examples, a display panel according to the present disclosure may include a cover window; an ink layer formed with a multi-layer structure on a rear surface of the cover window and directly adhered to a middle frame; and an adhesive layer disposed on the rear surface of the cover window and overlapping with the ink layer, and at least one layer of the ink layer may include a conductive material.

According to the present disclosure, it is possible to prevent an electric charge generated in a cover window from penetrating into a panel layer with a display panel with the above structure because electric charges that are generated in the cover window are discharged to the middle frame via the conduct material in the ink layer. As a result, the electric charges from the cover window do not penetrate inside the display panel to cause the shift phenomenon described herein.

Thus, according to at least some embodiments of the present disclosure, it is possible to prevent a transistor inside a panel layer from being shifted due at least to charges generated by the cover window.

According to one or more embodiments of the present disclosure, it is possible to prevent occurrence of the green phenomenon of a display panel that results at least from shifting of the transistor in the panel layer.

According to yet further embodiments of the present disclosure, it is possible to prevent delamination of an adhesive layer from a cover window by varying lengths of each layer of the ink layer that protrudes inward relative to the cover window.

According to at least some embodiments of the present disclosure, it is possible to omit a heat dissipation sheet locally at a peripheral edge.

The above description is non-limiting and additional features and advantages of the present disclosure will be understood with reference to the following description and the accompanying drawings.

DETAILED DESCRIPTION

Figure 1:
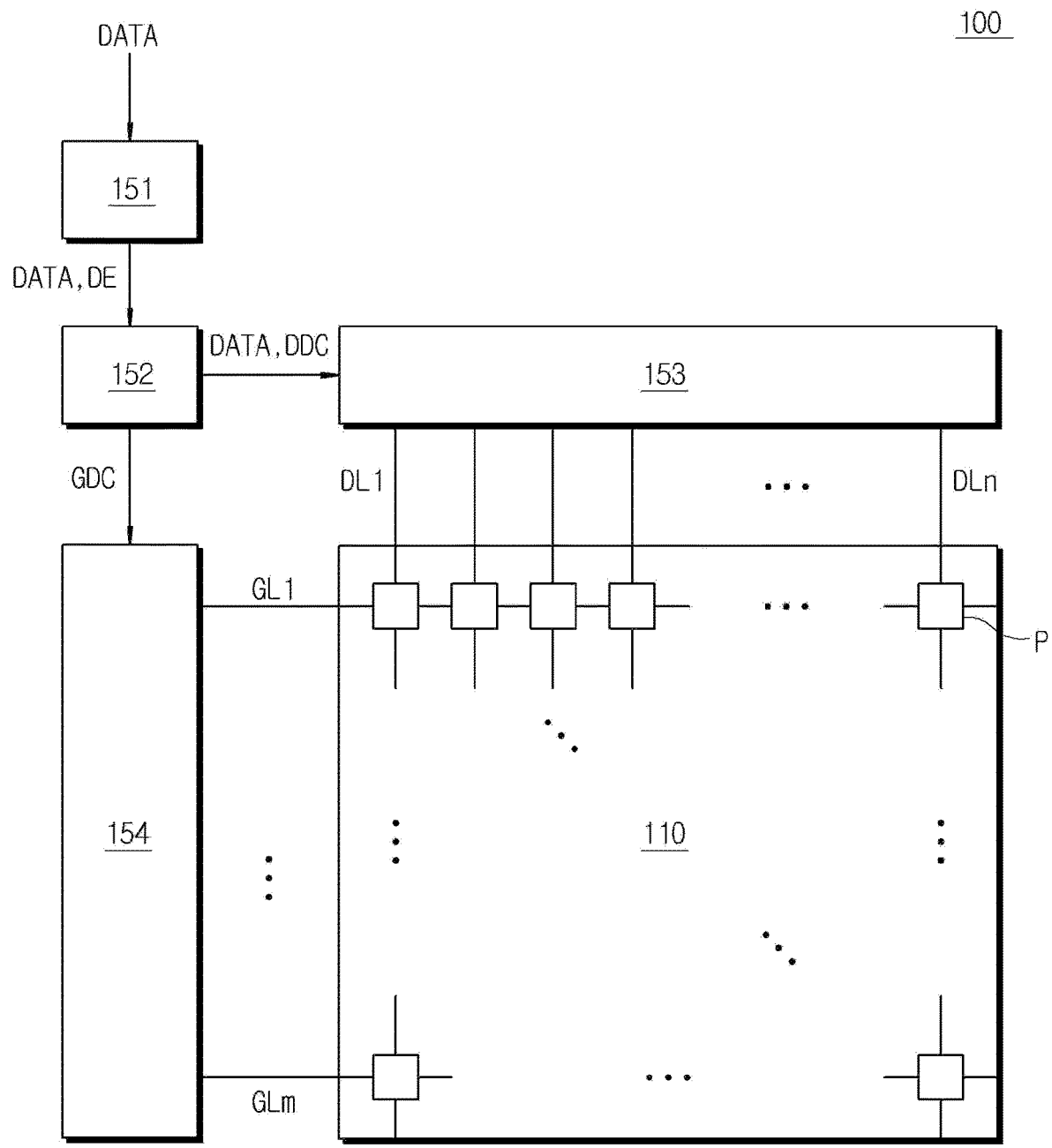
FIG. 1 is a block diagram of a display panel according to an embodiment of the present disclosure.

Hereinafter, the embodiments will be described with reference to the accompanying drawings. When an element (or an area, a layer, a part and the like) is described as being "on" another element, "connected" with, or "coupled" to another element, the element may be directly connected with or coupled to another element or a third intervening element may be disposed therebetween.

Like reference numerals of the accompanying drawings denote like elements. In addition, thicknesses, proportions and dimensions of the elements in the accompanying drawings are exaggerated for convenience of describing the specification. The term "and/or" includes any and all combinations of one or more of the associated listed items.

Though terms such as 'a first,' or 'a second' are used to describe various components, these components are not confined by these terms. These terms are merely used to distinguish one component from the other component. For example, without departing from the scope of the various embodiments of the present disclosure, a first component may be referred to as a second component, and similarly, a second component may be referred to as a first component. The singular forms expressed herein are intended to include the plural forms as well, unless the context expressly indicates otherwise.

Terms such as "below," "at a lower portion," "on," "at an upper portion" and the like are used to describe position relation of parts illustrated in the accompanying drawings. Such terms are of relative concept and do not limit the disclosure to the specifically illustrated or described positions, but rather, provide context for the features of the disclosure based on the directions marked in the drawings.

It should be understood that terms such as "comprise," or "have" and the like are used only to designate that there are features, numbers, steps, operations, components, parts or combination thereof, however such terms do not preclude existence or addition of one or more other features, numbers, steps, operations, components, parts or combination thereof.

The present disclosure will proceed to explain certain concepts with reference to an organic light emitting display panel as a non-limiting example for convenience of the description. However, is to be appreciated that the concepts of the present disclosure are not confined to organic light emitting display panels, and may be applied in the same way to other types of display panels such as a liquid crystal display panel, a mini-LED display panel, and the like.

FIG. 1 is a block diagram of a display panel 100 according to an embodiment of the present disclosure.

Referring to FIG. 1, the display panel 100 may include an image processor 151, a timing controller 152, a data driver 153, a gate driver 154, and a panel layer 110.

The image processor 151 may output a data enable signal (DE) and a data signal (DATA) with the data signal (DATA) being supplied from an external source. Apart from the data enable signal (DE), the image processor 151 may also output one or more additional signals, such as a vertical synchronizing signal, a horizontal synchronizing signal, a clock signal, or any combination thereof in some embodiments.

The timing controller 152 is supplied with one or more of the data signal (DATA), and a driving signal that includes the data enable signal (DE), a vertical synchronizing signal, a horizontal synchronizing signal and a clock signal from the image processor 151. The timing controller 152 may output a gate timing control signal (GDC) for controlling an operation timing of the gate driver 154 based on a driving signal, and a data timing control signal (DDC) for controlling an operation timing of the data driver 153.

In response to the data timing control signal (DDC) supplied from the timing controller 152, the data driver 153 may convert the data signal (DATA) into gamma reference voltages through sampling and latching, and output the gamma reference voltages thereafter. The data driver 153 may output the data signal (DATA) through data lines (DL1-DLn).

The gate driver 154 may output a gate signal while shifting a level of a gate voltage in response to the gate timing control signal (GDC) supplied by the timing controller 152. The gate driver 154 may output the gate signal through gate lines (GL1-GLm).

The panel layer 110 may display an image as sub-pixels (P) emit light in response to the data signal (DATA) and the gate signal supplied by the data driver 153 and the gate driver 154. The structure of the sub-pixels (P) according to at least some embodiments of the present disclosure will be described with reference to FIGS. 2 to 5.

Figure 2:
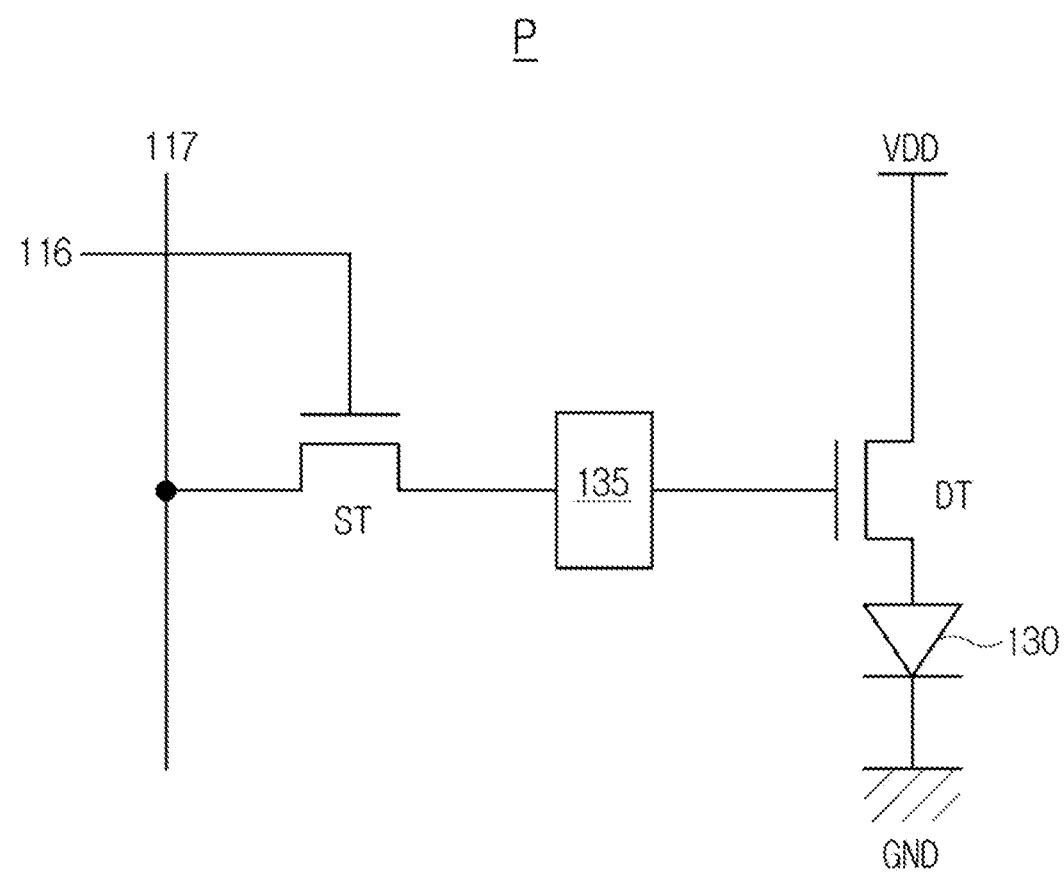
FIG. 2 is a circuit diagram of a sub-pixel of the display panel of FIG. 1 according to an embodiment of the present disclosure.

FIG. 2 is a circuit diagram of one sub-pixel (P) included in the display panel 100 according to an embodiment of the present disclosure.

Referring to FIG. 2, the sub-pixel (P) of the display panel 100 included in the display panel 100 may include a switching transistor (ST), a driving transistor (DT), a compensation circuit 135 and a light emitting element 130.

The light emitting element 130 may operate to emit light by a driving current formed by the driving transistor (DT).

The switching transistor (ST) may operate switching so that the data signal supplied through a data line 117 as a response to the gate signal provided through a gate line 116 can be saved as a data voltage in a capacitor.

The driving transistor (DT) may operate to flow a regular driving current between a high potential power line (VDD) and a low potential power line (GND), by corresponding to a data voltage stored in the capacitor.

The compensation circuit 135 compensates a threshold voltage of the driving transistor (DT) and the like, and the compensation circuit 135 may include one or more thin film transistors and capacitors. Configuration of the compensation circuit 135 may vary greatly depending on manners of compensation. For example, the sub-pixel (P) in FIG. 2 is configured as a 2T1C (two transistors and one capacitor) structure which includes a switching transistor (ST), a driving transistor (DT), a capacitor and a light emitting element 130. However, if a compensation circuit 135 is added thereto, the sub-pixel (P) may be configured variously such as 3T1C, 4T2C, 5T2C, 6T1C, 6T2C, 7T1C, 7T2C and the like where "T" generally refers to "transistor" and "C" generally refers capacitor such that 3T1C refers to three transistors and one capacitor and so forth.

Figure 3:
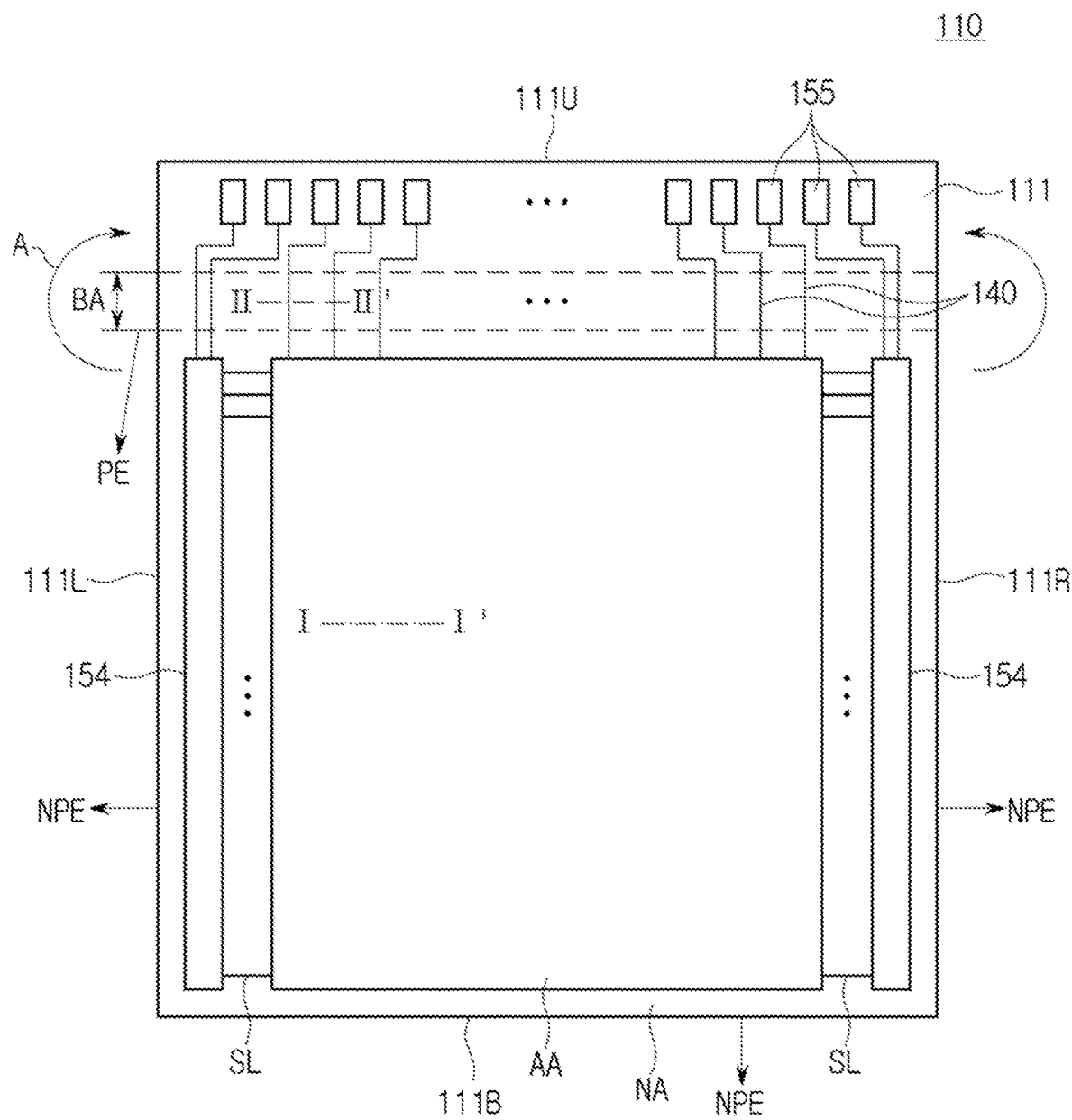
FIG. 3 is a top plan view of a panel layer of the display panel of FIG. 1 according to an embodiment of the present disclosure.

FIG. 3 is a top plane view of the panel layer 110 of the display panel 100 according to an embodiment of the present disclosure.

FIG. 3 shows an example of a state where the panel layer 110 of the display panel 100 is not bent.

Referring to FIG. 3, the panel layer 110 may include an active area (AA) where pixels emitting light through a thin film transistor and a light emitting element are disposed upon a flexible substrate 111, and a non-active area (NA) that is the bezel area surrounding edges of the active area (AA).

In the non-active area (NA) of the flexible substrate 111, a circuit such as the gate driving unit 154 to drive the panel layer 110 and the like and wirings of various signals such as a scan line (SL) and the like may be disposed.

A circuit to drive the panel layer 110 may be disposed upon the flexible substrate 111 in a Gate in Panel (GIP) manner, or may be connected to the flexible substrate 111 in a Tape Carrier Package (TCP) or Chip on Film (COF) manner.

FIG. 3 further shows that a plurality of pads 155 (which may be referred to herein as pads 155) of metal pattern may be disposed on an upper or top side 111U among four sides of the flexible substrate 111. The pads 155 are metal patterns on the flexible substrate 111 to be bonded with an external module. In the present disclosure, out of four sides shown in a state after the flexible substrate 111 is bent, a side on which the pads 155 are formed is referred to as a pad edge (PE). In other words, based on FIG. 3, a virtual line from which the bending starts in the bending area (BA) may be defined as a pad edge (PE). The virtual line is illustrated in FIG. 3 as a dashed line that is positioned where bending begins to occur in the flexible substrate 111, or at an interface between a flat portion of the flexible substrate (i.e., below the line in the orientation of FIG. 3) and the bending area (BA). In addition, out of four sides of the flexible substrate 111, the remaining sides where the pads are not formed are referred to as peripheral edges (NPE) in the present disclosure. Based on FIG. 3, the peripheral edges may be a left side 111L, a right side 111R and a lower or bottom side 111B of the flexible substrate 111 in some embodiments. Other configurations are possible, such as the pad edge (PE) being any of the left side 111L, right side 111R, or bottom side 111B and the peripheral edges (NPE) being the remaining sides in one or more embodiments. Additional details of the pad edge (PE) and the peripheral edges (NPE) will be provided in detail later on with reference to at least FIG. 8.

The bending area (BA) may be formed on a side of the non-active area (NA). The bending area (BA) may refer to an area of the flexible substrate 111 that is configured to be bent in a direction indicated by arrows A. Although the arrows A and the following description indicate only one direction of bending, the flexible substrate 111 may also be bent in an opposite direction to return the flexible substrate 111 to the flat state shown in FIG. 3, and potentially in other directions as well in some embodiments.

In the non-active area (NA) of the flexible substrate 111, wirings and a driving circuit in order to drive a screen are disposed. Since an image is not displayed in the non-active area (NA), the non-active area (NA) does not need to be visible to a user from a front surface of the flexible substrate 111. Therefore, an area to position the wirings and the driving circuit can be secured while at the same time reducing a size of the bezel or non-active area (NA), by bending some area of the non-active area (NA) of the flexible substrate 111.

Various wirings may be formed upon the flexible substrate 111. The wiring may be formed in the active area (AA) or in the non-active area (NA) of the flexible substrate 111. The wiring of circuits 140 is formed of a conductive material, and may be formed of a conductive material with excellent flexibility in order to reduce the likelihood of cracking when the flexible substrate 111 is bent. The wiring of circuits 140 may be formed of conductive materials having excellent flexibility such as gold (Au), silver (Ag), aluminum (Al) and the like, or any combination or alloy thereof. Or, the wiring of circuits 140 may be formed of alloys of magnesium (Mg) and silver (Ag), molybdenum (Mo), chrome (Cr), titanium (Ti), nickel (Ni), neodymium (Nd), and copper (Cu), among others. The wiring of circuits 140 may be formed in a multi-layer structure that includes various conductive materials, and for example, may be formed in a three-layer structure including titanium (Ti), aluminum (Al), and titanium (Ti) in sequential order in some embodiments.

The wiring of circuits 140 formed in the bending area (BA) is placed under a tensile force when being bent. The wiring of circuits 140 that extends in a direction that is the same as a bending direction in the flexible substrate 111 may receive the largest tensile force. Therefore, some of the wiring of circuits 140 disposed in the bending area (BA) may be formed to extend in a diagonal direction which differs from the bending direction to reduce localized concentration of tensile force (and thus reduce localized areas of high stress and strain) in the bending direction.

Figure 4:
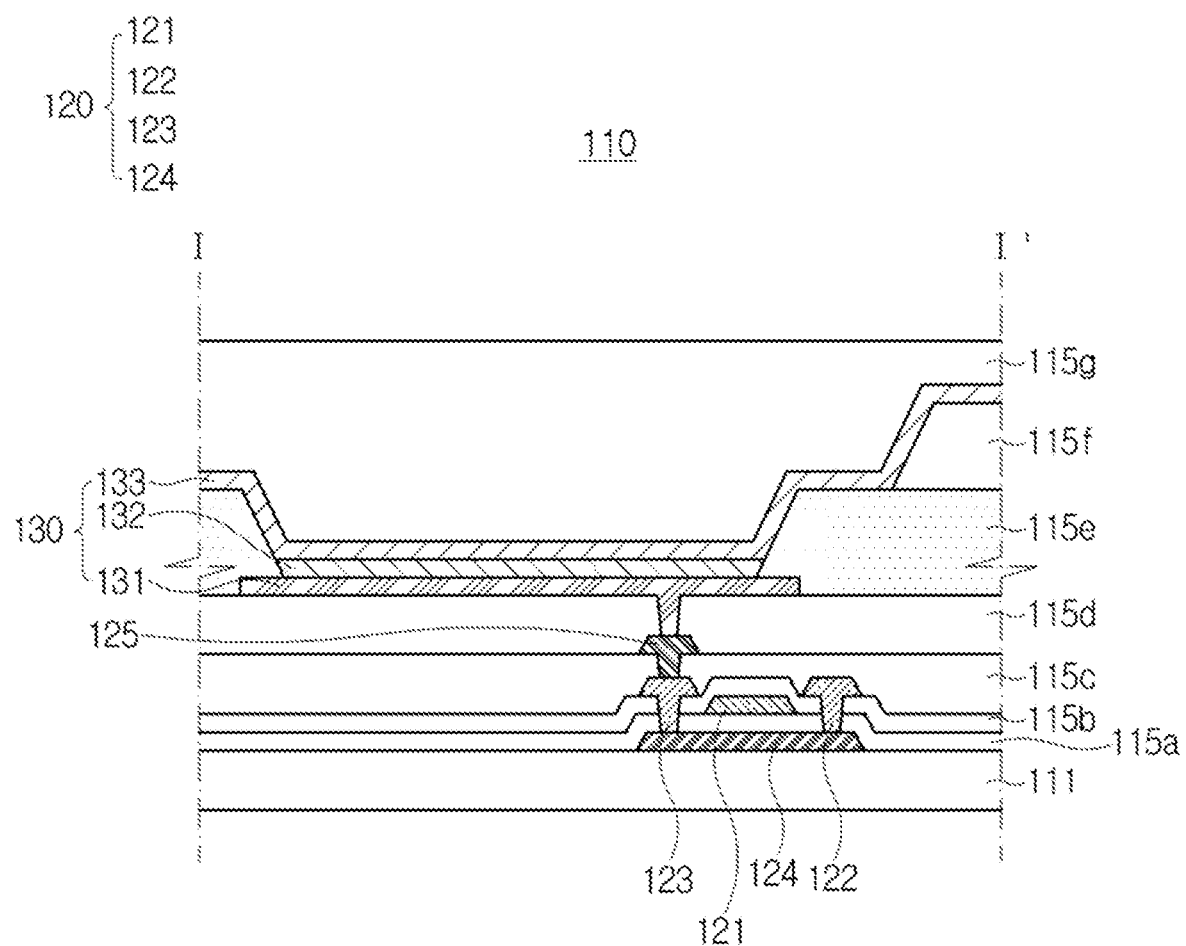
FIG. 4 is a cross-sectional view of the panel layer of the display panel of FIG. 3 taken along line I-I' of FIG. 3.

FIG. 4 is a cross-sectional view of the panel layer 110 taken along I-I' of FIG. 3.

Figure 5:
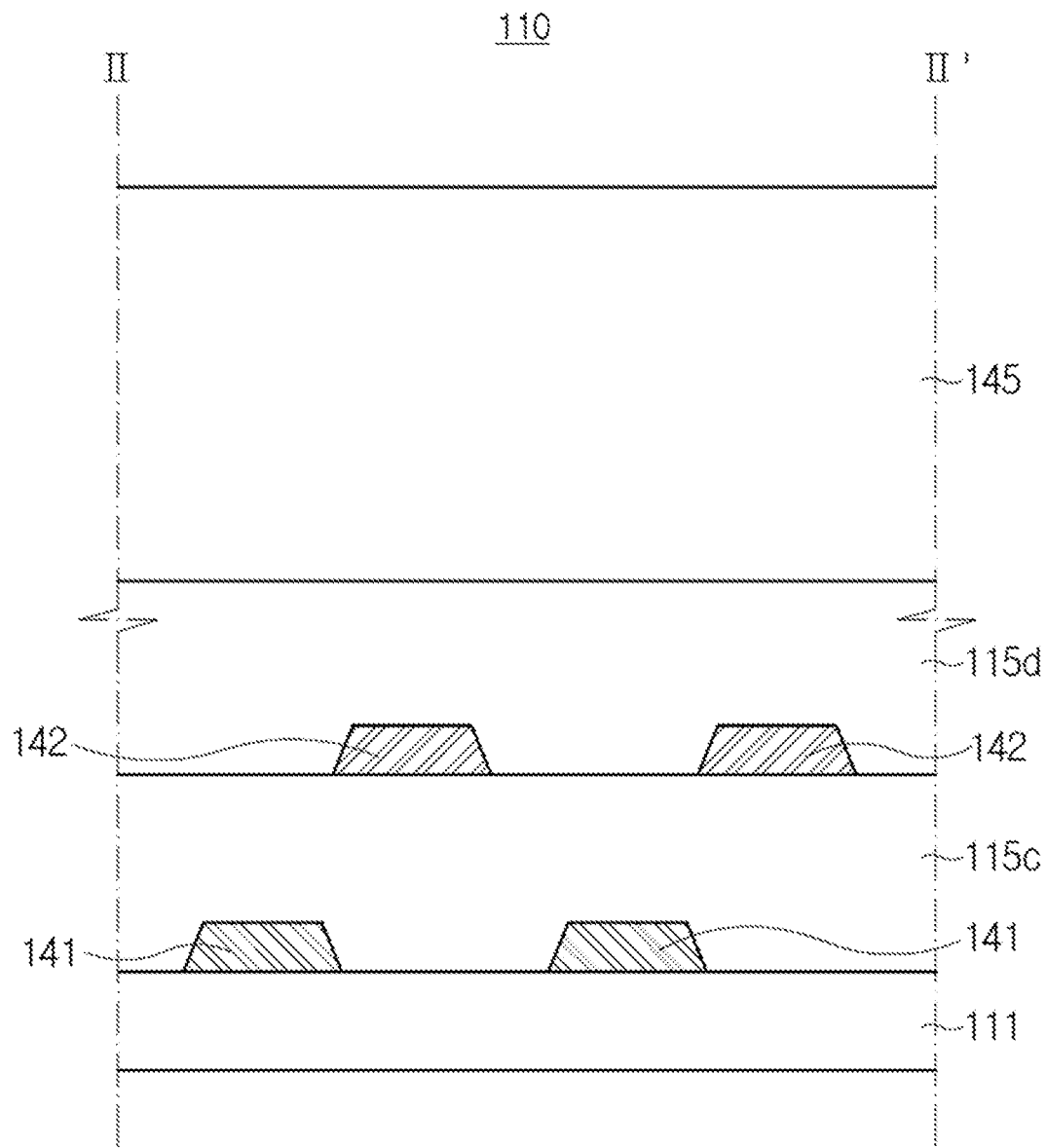
FIG. 5 is a cross-sectional view of the panel layer of the display panel of FIG. 3 taken along line II-II' of FIG. 3.

FIG. 5 is a cross-sectional view of the panel layer 110 taken along II-II' of FIG. 3.

The panel layer 110 according to the present disclosure will be described by referring to FIGS. 4 and 5.

More specifically, FIG. 4 is a cross-sectional view showing a structure of the panel layer 110 in the active area (AA) according to one or more embodiments of the present disclosure. Referring to FIG. 4, the flexible substrate 111 is a plate-shaped configuration disposed at a bottom of the panel layer 110, and serves to support and protect other components disposed upon the flexible substrate 111 in the panel layer 110. The flexible substrate 111 may be formed of glass or plastic, among other suitable materials. For example, the flexible substrate 111 may be formed of a film including one of the groups consisting of a polyester polymer, a silicone polymer, an acrylic polymer, a polyolefin polymer, and a copolymer thereof.

A buffer layer (not illustrated) may be further disposed on the flexible substrate 111. The buffer layer prevents penetration of moisture or foreign substance from the outside into the flexible substrate 111, and may also serve to flatten an upper surface of the flexible substrate 111. The buffer layer is not a necessary configuration, and may be omitted depending on a kind of thin film transistor 120 disposed in the flexible substrate 111.

The thin film transistor 120 is disposed in the flexible substrate 111 and may include a gate electrode 121, a source electrode 122, a drain electrode 123 and a semiconductor layer 124. The semiconductor layer 124 may be formed of amorphous silicon or polycrystalline silicon. The semiconductor layer 124 may be formed of an oxide semiconductor. The semiconductor layer 124 may include a drain region, a source region including p-type or n-type impurities and a channel region existing between the source region and the drain region. In addition, the semiconductor layer 124 may further include a lightly-doped region in the source region or the drain region located adjacent to the channel region.

The source region or the drain region are heavily doped with impurities and the source electrode 122 and the drain electrode 123 of the thin film transistor 120 may be connected thereto respectively.

Depending on a structure of the thin film transistor of N-type metal-oxide-semiconductor ("NMOS") logic or p-channel metal-oxide-semiconductor ("PMOS") logic, the channel region of the semiconductor layer 124 may be doped with n-type or p-type impurities.

A first insulation layer 115a may be formed with a single layer or multi-layer structure that consists of silicon oxide (SiOx) or silicon nitride (SiNx). The first insulation layer 115a may be disposed so that a current flowing through the semiconductor layer 124 does not flow to the gate electrode 121. The term "multi-layer" as used herein includes layer or material that is includes a plurality of individual layers, making up what can be termed "a layer" and that can functionally act as one layer, but it is comprised of a plurality of different layers. The gate electrode 121 may serve as a switch for turning on or off the thin film transistor 120 based on an electric signal transmitted from an external source through the gate line. The source electrode 122 and the drain electrode 123 are connected to the data line, and may transmit an electric signal from an external source from the thin film transistor 120 to the light emitting element 130.

A second insulation layer 115b may be formed on the first insulation layer 115a and the gate electrode 121. The second insulation layer 115b may be formed of a single layer or multiple layers of silicon oxide or silicon nitride to insulate the gate electrode 121, the source electrode 122 and the drain electrode 123 from each other.

A first planarization layer 115c and a second planarization layer 115d may be disposed on the second insulation layer 115b. The first planarization layer 115c and the second planarization layer 115d may be configurations to protect the thin film transistor 120 and flatten out steps formed by the thin film transistor 120. The first planarization layer 115c and the second planarization layer 115d may be formed of one or more materials among acrylic resin, epoxy resin, phenol resin, polyamide resin, unsaturated polyester resin, poly-phenylene resin, poly-phenylene sulfide resin, and benzocyclobutene.

An intermediate electrode 125 may be connected to the thin film transistor 120 through a contact hole formed in the first planarization layer 115c. The intermediate electrode 125 may electrically connect an anode electrode 131 to the drain electrode 123 of the thin film transistor 120.

The light emitting element 130 may be disposed on the second planarization layer 115d. The light emitting element 130 may include the anode electrode 131, a light-emitting portion 132 and a cathode electrode 133.

The anode electrode 131 is disposed on the second planarization layer 115d, and may serve to supply holes to the light-emitting portion 132. The anode electrode 131 may contact with the intermediate electrode 125 through a contact hole formed to penetrate the second planarization layer 115d. The anode electrode 131 may be formed of indium zinc oxide, indium tin oxide and the like which are transparent conductive materials.

A bank 115e may be disposed on the anode electrode 131 and the second planarization layer 115d. The bank 115e may define sub-pixels by dividing areas that actually emit light. A spacer 115f may be disposed on the bank 115e so as to prevent damage arising upon contacting with a deposition mask.

The light-emitting portion 132 may be disposed on the anode electrode 131. The light-emitting portion 132 may serve to emit light. The light-emitting portion 132 may include organic light emitting materials that emit light by themselves by an electric signal. The light-emitting portion 132 may include organic light emitting materials that emit colors, for example, red, green, blue, white and the like.

The cathode electrode 133 may be disposed on the light-emitting portion 132. The cathode electrode 133 may serve to supply an electron to the light-emitting portion 132. The cathode electrode 133 may be formed of a metal material such as magnesium (Mg), an alloy of silver and magnesium and the like. In addition, the cathode electrode 133 may be formed of transparent conductive oxides such as series of tin oxide, indium zinc oxide, indium tin oxide, indium zinc tin oxide, zinc oxide and the like.

An encapsulation layer 115g may be disposed on the cathode electrode 133. The encapsulation layer 115g may serve to prevent damage arising out of oxidization of components disposed below after penetration of moisture, oxygen, or a foreign material introduced from the outside into the components. The encapsulation layer 115g may be formed by laminating a plurality of barrier films. The encapsulation layer 115g may be formed of aluminum oxide or silicon nitride which are inorganic substances.

FIG. 5 is a cross-sectional view showing a structure of the panel layer 110 in the bending area (BA) according to at least some embodiments of the present disclosure. In describing FIG. 5, descriptions that are redundant with what are mentioned above will be omitted.

Referring to FIG. 5, the panel layer 110 of the display panel 100 according to the present disclosure may include a first wiring 141 and a second wiring 142 configured in a double-layer structure in the non-active area (NA) that includes the bending area (BA).

Specifically, in the flexible substrate 111, the first wiring 141 may be formed. In other words, the first wiring 141 is disposed on the flexible substrate 111, and in some non-limiting examples, may be disposed directly on the flexible substrate 111. On the first wiring 141, the first planarization layer 115c may be formed. In the first planarization layer 115c, the second wiring 142 may be formed. In other words, the second wiring 142 may be disposed on the first planarization layer 115c, and in some non-limiting examples, may be disposed directly on the first planarization layer 115c. On the second wiring 142, the second planarization layer 115d may be formed. On the second planarization layer 115d, a micro-coating layer 145 may be formed or disposed on the second planarization layer 115d.

The first wiring 141 and the second wiring 142 are configured to connect the panel layer 110 and the pad area (PA). The first wiring 141 and the second wiring 142 may be formed of conductive materials having excellent flexibility such as silver, gold, aluminum, and the like. Or, the first wiring 141 and the second wiring 142 may be formed of alloys of molybdenum, chrome, titanium, nickel, neodymium, copper, silver and the like.

When the flexible substrate 111 is bent, stress is applied to the bending area (BA). A crack may occur in layers that wrap wirings due to such stress in conventional display devices. Also, a large space to arrange wirings is utilized when forming wirings in a single layer. By configuring wirings 141, 142 in the bending area (BA) in a multi-layer structure as in embodiments of the present disclosure, it is possible to reduce stress occurring in layers wrapping the wirings and decrease the space utilized by the wirings. As a result, cracks are significantly less likely to form in the bending area (BA) according to embodiments of the flexible substrate 111 and the wirings 141, 142 of the present disclosure.

Figure 6:
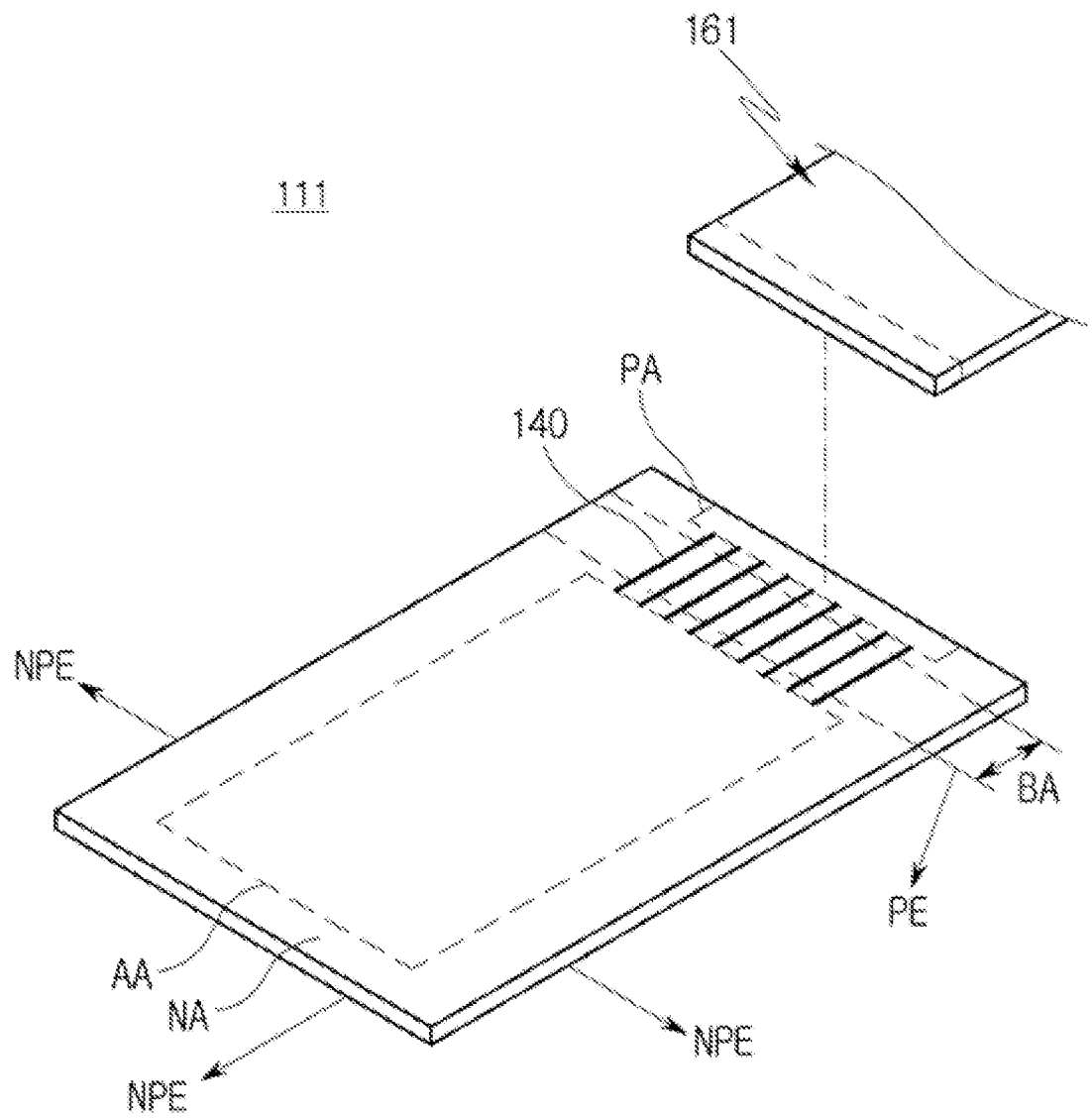
FIG. 6 is a perspective view of a flexible substrate of the display panel of FIG. 1 according to an embodiment of the present disclosure.

FIG. 6 is a perspective view of the flexible substrate 111 according to an embodiment of the present disclosure.

Figure 7:
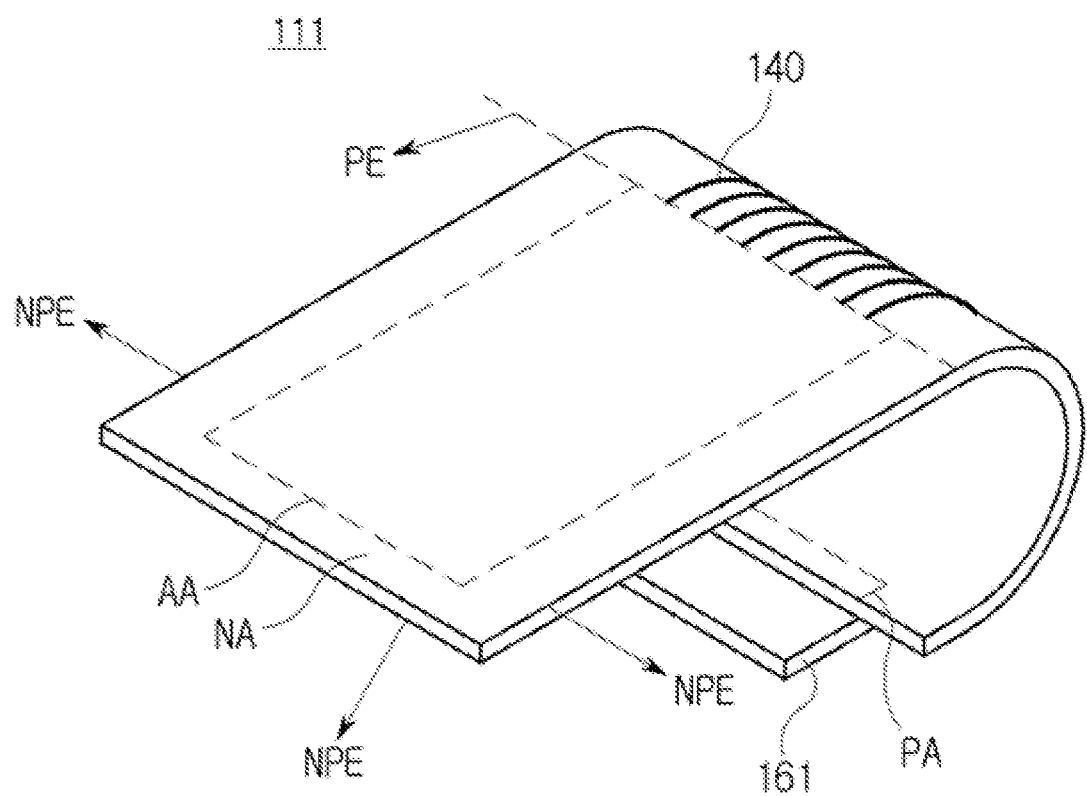
FIG. 7 is a perspective view of the flexible substrate of FIG. 6 in a bent position according to an embodiment of the present disclosure.

FIG. 7 is a perspective view of the flexible substrate 111 in a bent position according to an embodiment of the present disclosure.

Figure 8:
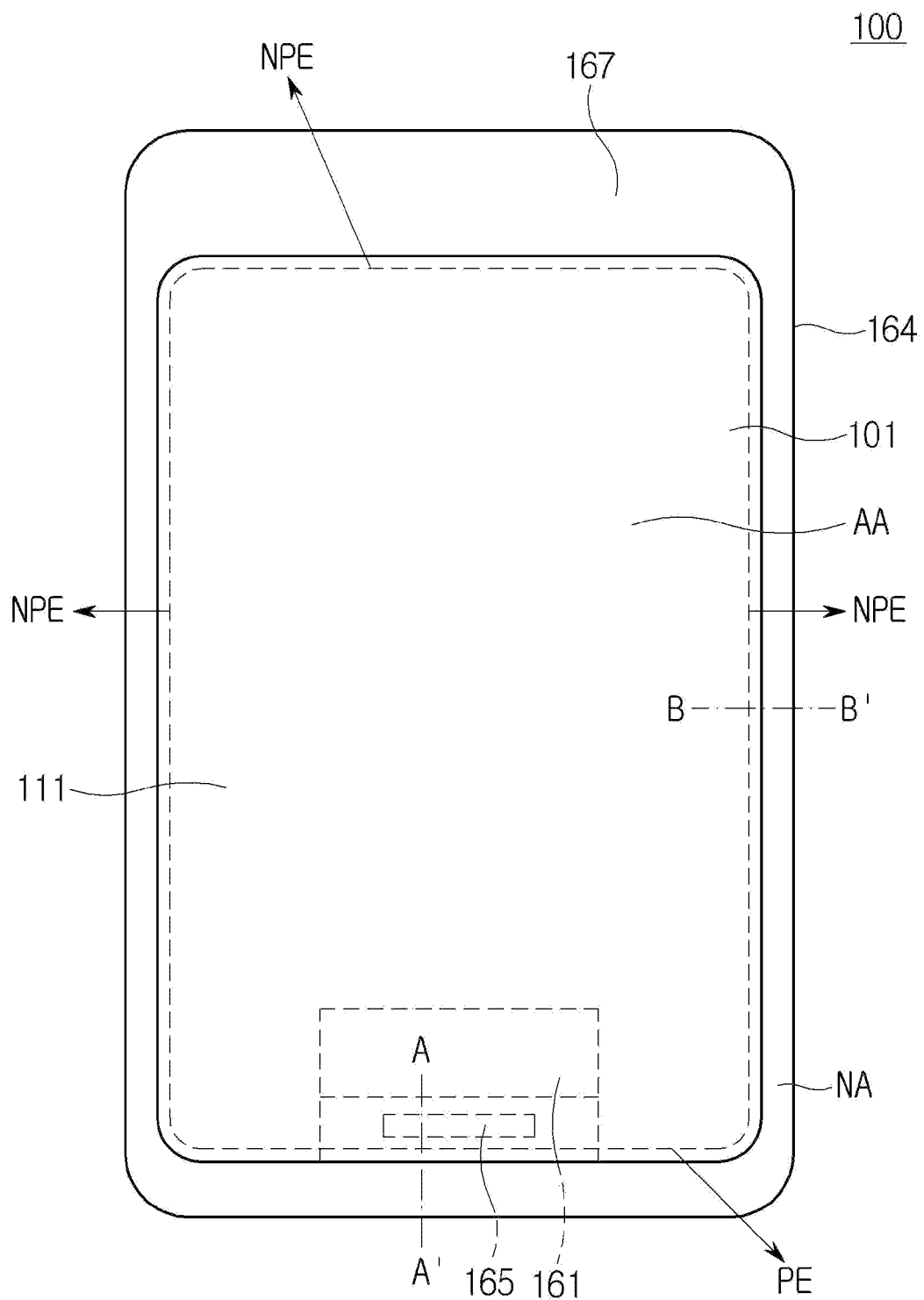
FIG. 8 is a top plan view that shows the bent flexible substrate of FIG. 7 incorporated into a display panel according to an embodiment of the present disclosure.

FIG. 8 is a top plan view that shows the bent flexible substrate 111 incorporated into the display panel 100 according to an embodiment of the present disclosure.

Referring to FIGS. 6 to 8, the flexible substrate according to the present disclosure will be explained.

Referring to FIG. 6, the flexible substrate 111 may be divided into the active area (AA) and the non-active area (NA) surrounding edges of the active area (AA). The non-active area (NA) includes the pad area (PA) in which the pads 155 (FIG. 3) are disposed. In the active area (AA), a plurality of sub-pixels (P) are disposed. The sub-pixels (P) may be divided by gate lines and data lines that cross each other.

A circuit element 161 may be a configuration that is connected with the pads 155 (FIG. 3) in the pad area (PA) of the flexible substrate 111. The circuit element 161 may include bumps or steps. The bumps of the circuit element 161 may be connected with the pads 155 (FIG. 3) of the pad area (PA) through an anisotropic conductive film. The circuit element 161 may be a Chip on Film (COF) in which a driver IC is mounted in a flexible film. In addition, the circuit element 161 may be bonded to the pads 155 (FIG. 3) directly through Chip on Glass (COG) process. Also, the circuit element 161 may be a flexible circuit such as a Flexible Printed Circuit (FPC). The present disclosure will be described based on COF taken as an example of the circuit element 161.

As explained previously, out of four sides of the flexible substrate 111 or the display layer 110, a side that includes the pad area (PA) and the pads 155 (FIG. 3) is defined as the pad edge (PE) and a side where the pads 155 (FIG. 3) are not formed is defined as the peripheral edge (NPE). In other words, in an assumption that the flexible substrate 111 is a square shape, one side is the pad edge (PE), and the remaining three sides may be referred to as the peripheral edges (NPE). In the top plan view illustrated in FIG. 8, the lower side of the flexible substrate 111 at which the driver IC 165 and the circuit element 161 are bent is the pad edge (PE) and the remaining three sides (the left, the right and the upper side) may be the peripheral edges (NPE). The pad edge (PE) is folded below the main body of the flexible substrate 111 in FIG. 8 and is therefore shown in dashed lines. The cutting line A-A' of FIG. 8 is cuts through the pad edge (PE), and the cutting line B-B' is cuts through one of the peripheral edges (NPE). FIGS. 9 to 12 and FIG. 18 to be described later on show cross sections of the pad edge (PE) taken along A-A' according to one or more embodiments of the present disclosure. Also, FIGS. 13 to 17 and FIG. 19 show cross sections of the peripheral edge (NPE) taken along B-B' according to one or more embodiments of the present disclosure.

Returning to FIG. 7, the flexible substrate 111 may be bent in a rear direction so that a side contacting with the pad area (PA) can have a predefined curvature. As the flexible substrate 111 gets bent, the pad area (PA) may overlap with the active area (AA) in a rear direction of the active area (AA). At the front of the display panel 100, the circuit element 161 or the driver IC 165 may not be made visible, but rather, are positioned below the flat portion of the flexible substrate 111 illustrated in FIG. 7. For bending, the flexible substrate 111 may be formed of a flexible material. For example, the flexible substrate 111 may be formed of a plastic material such as polyimide. In other words, the pad area (PA) and a portion of the flexible substrate 111 that includes the wiring circuits 140 may be bent underneath a flat portion of the flexible substrate 111 that includes the active area (AA), as shown in FIG. 7. In such a bent position, the side or portion of the flexible substrate 111 that extends between the pad area (PA) and the flat portion of the flexible substrate 111 that contains the active area (AA) has a predetermined curvature or radius of curvature. As shown in FIG. 7, the pad edge (PE) is disposed at an interface between a boundary of the active area (AA) and the curved portion of the flexible substrate 111 with the area to the left of the pad edge (PE) being flat and the area to the right of the pad edge (PE) in the orientation of FIG. 7 being curved and disposed underneath and overlapping at least a portion of the active area (AA).

Referring to FIG. 8, on a surface (such as a front or top surface) of the bent flexible substrate 111, the cover window 164 may be coupled. The cover window 164 is formed to be larger than the bent flexible substrate 111 so that the cover window 164 can accommodate the flexible substrate 111 inside the cover window 164.

Also, on another surface (such as a rear or bottom surface) of the bent flexible substrate 111, a backplate 101 may be coupled. The backplate 101 may serve to maintain rigidity of the display panel 100, prevent foreign substances from attaching to the bottom portion of the display panel 100, and absorb external shocks. The backplate 101 may be implemented as a plastic thin film made of polyimide. Forming the backplate 101 not in the bending area (BA) may be appropriate. As to be described later on, the backplate 101 may include a first backplate 101a and a second backplate 101b.

Figure 9:
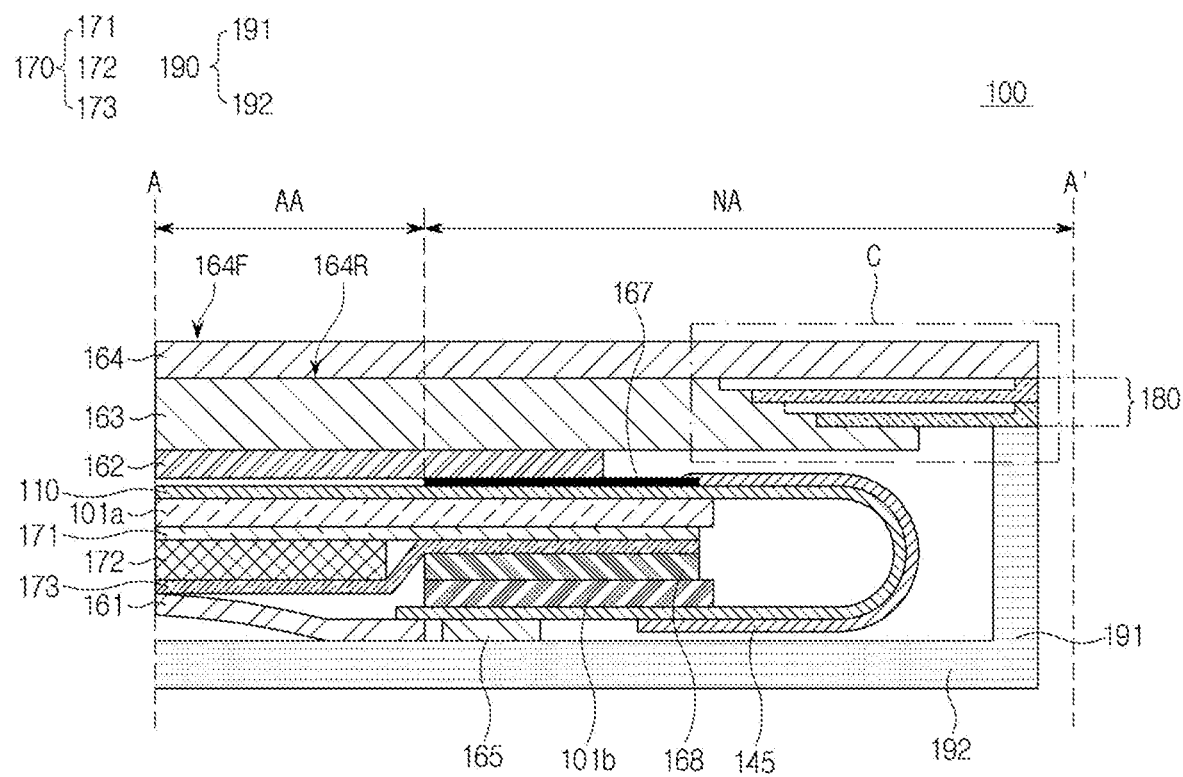
FIG. 9 is a cross-sectional view of the display panel of FIG. 8 taken along line A-A' of FIG. 8 according to an embodiment of the present disclosure.

FIG. 9 is a cross-sectional view taken along line A-A' of the display panel 100 of FIG. 8 according to an embodiment of the present disclosure.

Figure 10:
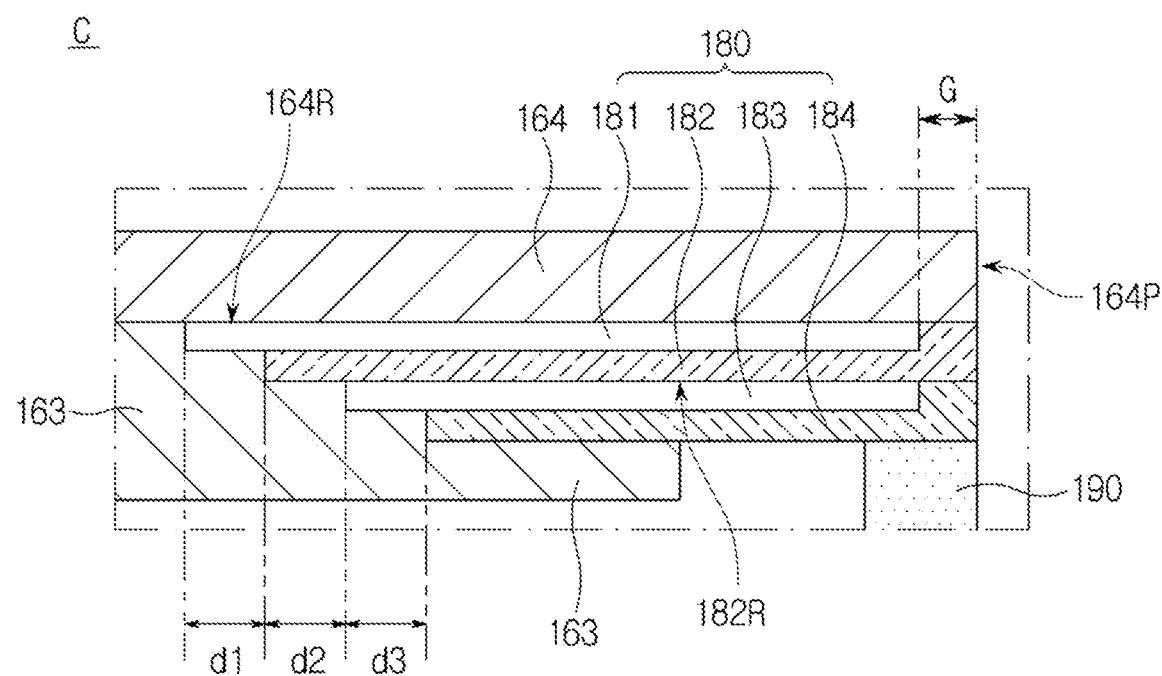
FIGS. 10 to 12 are enlarged views of area C of FIG. 9 according to one or more embodiments of the present disclosure.
Figure 11:
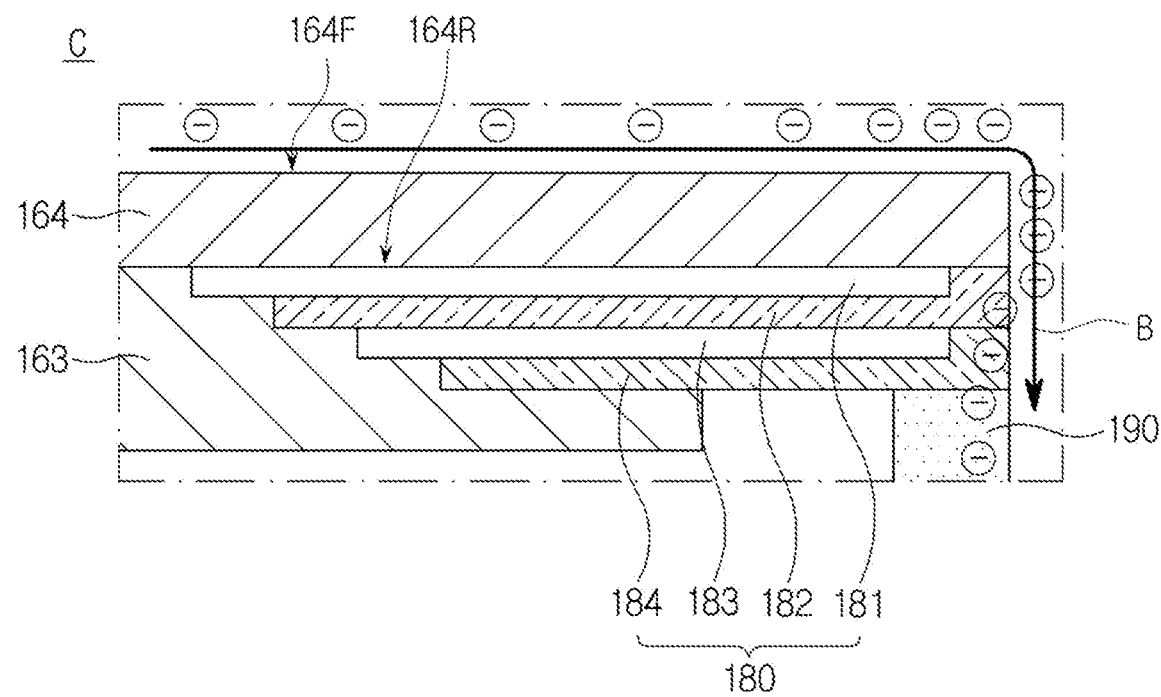
Figure 12:
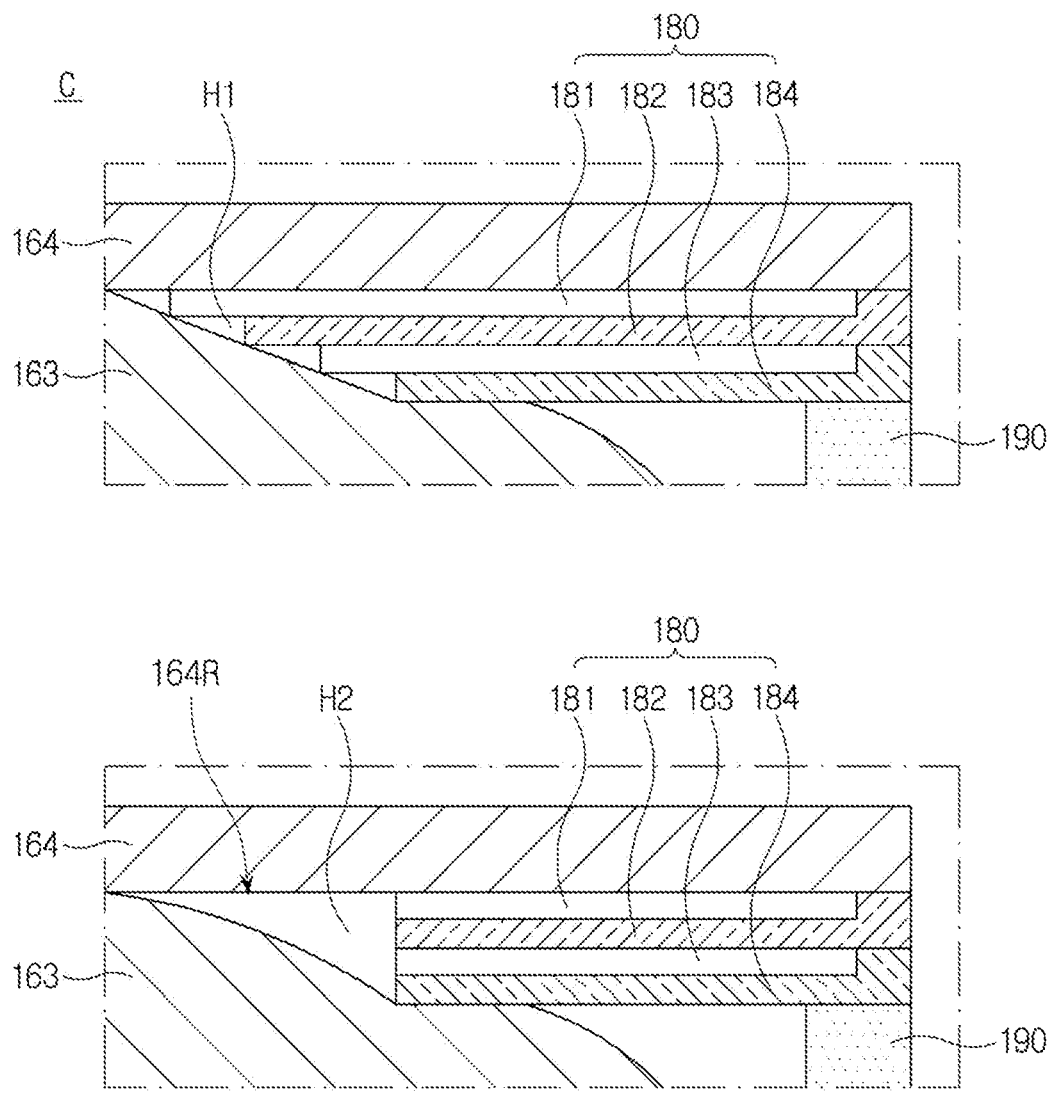

FIGS. 10 to 12 are enlarged views of area C part of FIG. 9 according to an embodiment of the present disclosure.

By referring to FIGS. 9 to 12, the display panel 100 according to an embodiment of the present disclosure will be explained below.

As explained above, FIG. 9 is a cross-sectional view taken along line A-A' of FIG. 8 that shows the pad edge (PE) and the pad area (PA) including the pads 155 (FIG. 3) of the display panel 100 in more detail.

Referring to FIG. 9, the display panel 100 may include the cover window 164 which is the uppermost layer, an adhesive layer 163 disposed below the cover window 164, a polarizer 162 disposed below the adhesive layer 163 and the panel layer 110 disposed below the polarizer 162. As described by referring to FIG. 4, the panel layer 110 may include the flexible substrate 111 and may be bent in the bending area (BA). FIG. 7 illustrates a bent panel layer 110 which includes the flexible substrate 111 in the bent state.

The cover window 164 is disposed on an uppermost layer of the display panel 100 and may be formed of glass or plastic. The cover window 164 serves as a protection layer protecting internal elements of the display panel 100 and forms an outside surface of the display panel 100. Therefore, the cover window 164 is contacted by a finger of a user during operation, which may produce an electric charge due to friction. The electric charge may also generated by contact between the cover window 164 and other substances, such as fabric. The electric charge generated by friction and the like may transfer along a side of the cover window and penetrate into the inside of the display panel in a conventional display device.

The adhesive layer 163 is disposed below the cover window 164 and serves to adhere or otherwise couple the cover window 164 to the polarizer 162. The adhesive layer 163, for example, may be an Optical Clear Adhesive (OCA) or a Pressure Sensitive Adhesive (PSA) and may be of a transparent material.

The polarizer 162 may be formed of a film having a feature of polarization. The polarizer 162 may suppress reflection of external light and reduce luminous reflectance when viewed from outside the display panel 100. The polarizer 162 may be disposed in the active area (AA).

The panel layer 110 may be a layer where pixels are formed and transistors including the gate electrode, the source electrode, the drain electrode and the semiconductor layer described above formed inside or as part of the panel layer 110. In addition, the panel layer 110 may be a layer where light emitting diodes such as anode electrode, the light emitting layer and the cathode electrode and the like are formed. If a frictional charge penetrates into the inside of the panel layer of a conventional display device, the shift phenomenon may occur in the transistor, then deterioration in the screen quality may occur due to the green phenomenon described herein.

The first backplate 101a is a firm structure disposed below the panel layer 110 and may serve to reinforce rigidity of the panel layer 110. The backplate 101 may be formed of a plastic thin film.

A support member 170 may be configured as a three-layer structure consisting of the adhesive 171, a cushion tape 172 and a heat dissipation sheet 173. The adhesive 171 may be formed on a rear surface of the first backplate 101a. The adhesive 171 may include an embossed pattern. The embossed pattern may prevent bubbling. The cushion tape 172 may serve to be pressed and absorb a shock when an external shock is given thereto. The cushion tape 172 may be formed on a rear surface of the adhesive 171. The heat dissipation sheet 173 may be disposed below the cushion tape 172. The heat dissipation sheet 173 may serve to dissipate heat. The heat dissipation sheet 173 may be formed of, for example, a metal material such as copper in order to dissipate heat being generated in the driver IC 165 or the circuit element 161, among others. Also, the heat dissipation sheet 173 may serve as a ground that discharges the electric charge transferred along the travel path formed by an antistatic solution.

A black matrix 167 may be formed in some areas on the panel layer 110. The black matrix 167 may be formed along edges of the panel layer 110 in some embodiments. The black matrix 167 may be formed of a black ink.

The micro-coating layer 145 may be disposed on the outer surface of the panel layer 110 in the bending area (BA). The micro-coating layer 145 may serve to protect wirings that extend from the pads 155 (FIG. 3) disposed in the pad area (PA). The micro-coating layer 145 may be formed of acrylic materials such as an acrylate polymer.

The adhesive tape 168 may be disposed between the heat dissipation sheet 173 and the second backplate 101b. The adhesive tape 168 may serve to reduce a curvature of the bending area (BA) by having a predefined thickness. Further, the adhesive tape 168 may serve to absorb a shock by an external force since the adhesive tape 168 may increase a thickness of the cushion tape 172.

A second backplate 102b is a firm structure disposed below the heat dissipation sheet 173 and may serve to reinforce rigidity of the panel layer 110 at an end of the bending area (BA).

The driver IC 165 and the circuit element 161 may be connected with each other. The circuit element 161 may be a Flexible Printed Circuit Board (FPCB). The driver IC 165 may be an IC such as a data driver, a timing controller and the like.

According to at least some embodiments of the present disclosure, the ink layer 180 may be formed on a rear surface 164R of the cover window 164. The ink layer 180 may be configured as a multi-layer structure and may be adhered directly to a middle frame 190. In addition, the ink layer 180 may overlap with the adhesive layer 163. For example, the ink layer 180 with a multi-layer structure may be formed on the rear surface 164R of the cover window 164, and the adhesive layer 163 may be formed on a rear surface of the cover window 164. The adhesive layer 163 is a flexible material such as an OCA or PSA and thus, may contact with some part of the ink layer 180 while the adhesive layer 163 is formed. One of the layers comprising the multi-layer structure of the ink layer 180 may include a conductive material.

The middle frame 190 may be a support frame surrounding the display panel 100 and forming a lower or bottom boundary of the display panel 100 in some embodiments. The middle frame 190 may include a vertical portion 191 and a horizontal portion 192. The middle frame 190 may form an appearance of the display panel 100. The middle frame 190 preferably has rigidity and may be formed of a metal material. The middle frame 190 may include the vertical portion 191 extending vertically and the horizontal portion 192 extending horizontally in the orientation of FIG. 9. The middle frame 190 may be adhered directly to the ink layer 180. As illustrated in FIG. 9, the vertical portion 191 of the middle frame 190 may be directly adhered to the ink layer 180. Such a middle frame 190 may be, as described below, configured to provide a travel path to discharge an electric charge generated by friction and the like on a front or top surface 164F of the cover window 164 and prevent occurrence of the shift and green phenomena described herein.

With reference to FIG. 10, a detailed structure of the ink layer 180 according to at least one embodiment will be explained.

The ink layer 180, for example, may include four layers in some embodiments. Specifically, a first layer 181 adhered to the rear surface 164R of the cover window 164 may be formed with one end thereof (i.e., a right end in the orientation of FIG. 10) spaced apart by a gap (G) from an end or outer peripheral edge (164P) of the cover window 164. A second layer 182 may be a layer formed below the first layer 181 and may be disposed directly on the first layer 181 in some embodiments. The second layer 182 may not be spaced apart by the gap (G) from the end 164P of the cover window 164. Therefore, one end of the second layer 182 may be formed to penetrate into and through the gap (G) formed between the end of the first layer 181 and the end 164P of the cover window 164. Thus, one end of the second layer 182 may be in direct contact with the rear surface 164R of the cover window 164. A third layer 183 may be a layer formed below the second layer 182 and may be disposed directly on the second layer 182 in some embodiments. The third layer 183 may be formed to be spaced apart by the gap (G) from the end 164P of the cover window 164. A fourth layer 184 may be a layer formed below the third layer 183 and may be disposed directly on the third layer 183 in some embodiments. The fourth layer 184 may not be spaced apart by the gap (G) from the end 164P of the cover window 164. Accordingly, one end of the fourth layer 184 may be formed to penetrate into and through at least a portion of the gap (G) formed between the ends of the third layer 183 and the cover window 164. Therefore, one end of the fourth layer 184 may contact with a rear surface 182R of the second layer 182. For example, the gap (G) may be 0.5 mm wide in some embodiments, or more or less. The display panel 100 according to at least some embodiments in this structure may form a travel path for an electric charge. Description thereof will be provided later on with reference to FIG. 11.

For example, the first layer 181 may have a height of 4 um (with um referring to micrometers). The second layer 182 may have a height of 4 um. A height of the portion of the second layer 182 that penetrates into the gap (G) to contact the cover window 164 may be 8 um (i.e., a thickness of the first and second layers 181, 182 combined). The third layer 183 may have a height of 4 μm. The fourth layer 184 may have a height of 4 um. A height of the portion of the fourth layer 184 that penetrates into the gap (GP) to contact the second layer 182 may be 8 um (i.e., a thickness of the third and fourth layers 183, 184 combined). As a result, the overall height of the ink layer 180 may be 16 μm in some non-limiting examples. Other configurations of the layers 181, 182, 183, 184 are contemplated herein, including the layers 181, 182, 183, 184 having the same or different heights or thickness relative to each other, and more or less than the amounts stated above.

In addition, another opposite end (i.e., a left end in the orientation of FIG. 10) of the first layer 181 may protrude further inward relative to the cover window 164 than another end of the second layer 182. Here, the term "inward" refers to a direction towards a center of the display panel 100 and refers to a direction toward line A in FIG. 10. For example, another end of the first layer 181 may protrude further by d1 than another end of the second layer 182. Another end of the second layer 182 may protrude further inward than another end of the third layer 183. For example, another end of the second layer 182 may protrude further inward by d2 than another end of the third layer 183. Another end of the third layer 183 may protrude further inward than another end of the fourth layer 184. For example, another end of the third layer 183 may protrude further inward than another end of the fourth layer 184 by d3. For example, a length of each of d1 to d3 may be 0.4 mm in some embodiments. The distances d1, d2, d3 may each be the same or different and may be more or less than 0.4 mm. Such a structure may prevent delamination of the adhesive layer 163 and this will be explained later on with reference to FIG. 12.

With reference to FIG. 11, the travel path of an electric charge according to one or more embodiments will be described.

According to embodiments of the disclosure, the second layer 182 and the fourth layer 184 may include a conductive material, or all of the layers 181, 182, 183, 184 or any combination thereof may include the conductive material. The conductive material may include conductive balls or conductive wires. For example, each layer 181, 182, 183, 184 of the ink layer 180 may be formed of one or more materials among acrylic resin, epoxy resin, phenol resin, polyamide resin, and benzocyclobutene. A conductive ball included in each layer 181, 182, 183, 184 may be a conductive ball on which a conductive film is formed by pre-treating the ball formed of a polymer-based material and sputtering on the outer shell of the polymer ball. The conductive wire may be a silver nanowire formed of silver (Ag). The conductive wire is divided into a conductive section and an insulator section and conductive wires are irregularly disposed through the respective layer 181, 182, 183, 184. The conductive ball or conductive wire are examples that can make each of the ink layers 181, 182, 183, 184 have conductivity, and another type of a conductive layer having conductivity or other methods for providing conductivity to the layers 181, 182, 183, 184 may be used.

In a non-limiting example, if the second layer 182 and the fourth layer 184 include conductive balls, it is preferable to form the conductive balls at a ratio of 20% to 30% by volume of the layers 182, 184. Further, each of the conductive balls may have a diameter of 10 μm. In addition, each of the conductive balls may have a blue series color. Each of the conductive balls may have a surface resistance of 104 to 109 Ohm/sq. Other configurations are possible, including larger or smaller diameter balls in a different volume percentage relative to the layers 182, 184.

For example, if the second layer 182 and the fourth layer 184 include conductive wires, it is preferable to form the conductive wires at a ratio of 10% to 20% by volume. Also, each of the conductive wires may be 25 um long and may have a diameter of 25 nm (i.e., nanometers). In addition, each of the conductive wires may have a gray series color. Each of the conductive wires may have a surface resistance of 20 to 80 ohm/sq. As with the conductive balls, other configurations for the conductive wires are possible.

Referring to the travel path of the electric charge illustrated in FIG. 11, the electric charge may be generated on the front or top surface 164F of the cover window 164. Since the front or top surface 164F of the cover window 164 is exposed to an external environment, the electric charge may be generated by a touch of a user or contact with an external surface or material, and the like. The electric charge moves in a bottom direction along the outer surface of the cover window 164 generally indicated by arrow B, and if the electric charge moves to the display panel, more particularly, to the inside of the panel layer, the transistor provided in the inside of panel layer in a conventional display device may be shifted, and that will lead to screen quality deterioration due to the green phenomenon. Some conventional display devices include a method to form a travel path of the electric charge by applying an antistatic solution on sides of the adhesive layer, polarizer, panel layer and the like towards the heat dissipation sheet to discharge the electric charges. Such a method had problems in that the antistatic solution may not be properly applied and the applied antistatic solution may be removed after application is done, and in particular, it was difficult to apply the antistatic solution at a lower portion of the pad edge due to the bent structure of the panel layer.

According to embodiments of the present disclosure, by directly adhering the ink layer 180 having conductivity to the middle frame 190 including a metal material, an electric charge may move through the ink layer 180 to the middle frame 190. The transferred electric charge may be discharged through the middle frame 190. Particularly, the second layer 182 is formed to penetrate into the first layer 181 and may include a conductive material. Also, the fourth layer 184 is formed to penetrate into the third layer 183 and may include a conductive material. By the penetration, the fourth layer 184 is in direct contact with the second layer 182. Therefore, on the rear surface 164R of the cover window 164, the travel path of the electric charge along the second layer 182, fourth layer 184 and the middle frame 190 may be formed and shown with circles in FIG. 11.

With reference to FIG. 12, improvement on delamination of the adhesive layer 163 according to embodiments of the disclosure will be explained.

The drawing (a) of FIG. 12 is a detail view of area C of FIG. 8 according to embodiments of the disclosure, and the drawing (b) of FIG. 12 shows a similar cross section according to a comparative example.

Referring to (a) of FIG. 12, as explained above, each layer of the ink layer 180 may protrude further inward relative to the cover window 164 and/or display panel 100 compared with layers disposed at a lower portion in a step-down configuration of the sequential layers 181, 182, 183, 184. Particularly, the first layer 181 may protrude further than the second layer 182 by d1, the second layer 182 may protrude further than the third layer 183 by d2, and the third layer 183 may protrude further than the fourth layer 184 by d3 (FIG. 10). As a result of the sequential protrusion structure of the ink layer 180, the ink layer 180 may have an overall inclined structure. With reference to the drawing (b) of FIG. 12, a protruding degree of each of the ink layer 180 is the same compared with other layers disposed below. In other words, each of the layers 181, 182, 183, 184 of drawing (b) have the same width and do not have a step-up or step-down configuration as in drawing (a). In the drawing (b) of FIG. 12, the ink layer 180 does not have an inclined structure as a result. The adhesive layer 163 is an OCA or PSA and may be of a flexible material. Therefore, if the adhesive layer 163 contacts the cover window 164 where the ink layer 180 is formed on the rear surface 164R thereof, the adhesive layer 163 may be elevated and may cover some part of the ink layer 180. Thereafter, during curing of the adhesive layer 163, the adhesive layer 163 shrinks and moves inward by a certain distance. As shown in drawing (a) and drawing (b) of FIG. 12, spaces H1, H2 are formed between the cover window 164 and the adhesive layer 163 as a result of the shrinkage of the adhesive layer 163 during curing. If the spaces H1, H2 are formed large, the adhesive layer 163 may be easily delaminated from the cover window 164. The space H1 in a drawing (a) of FIG. 12 is smaller than the space H2 in a drawing (b) of FIG. 12, and may be multiple orders of magnitude smaller (i.e., at least twice, three times, or more smaller) than the space H2. That is, according to embodiments of the disclosure, it is possible to minimize the space H1 formed between the cover window 164 and the adhesive layer 163 as a result of the structure of the ink layer 180. Therefore, the structure of the ink layer 180 according to the disclosure may improve the problem of delamination occurring between the cover window 164 and the adhesive layer 163. While the structure of drawing (a) in FIG. 12 may be a particularly advantageous embodiment, the concepts of drawing (b) represent a useful improvement due to the ink layer 180, and may be preferred in some applications.

Figure 13:
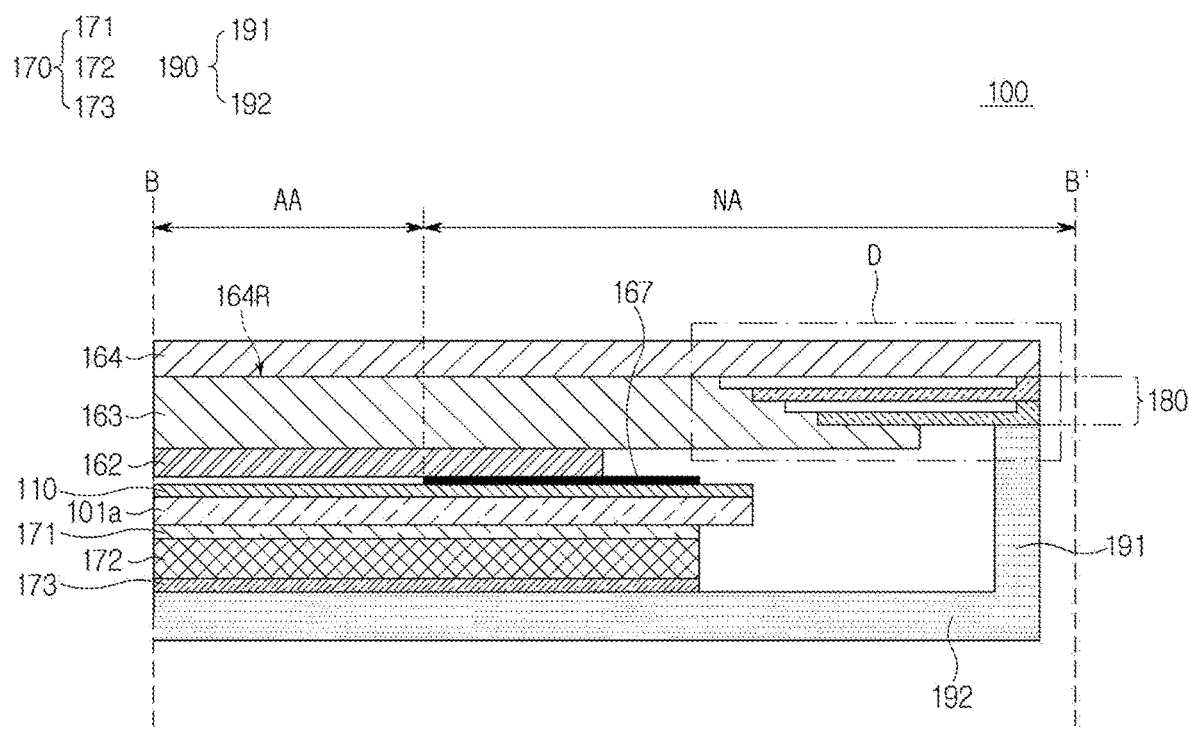
FIG. 13 is a cross-sectional view of the display panel of FIG. 8 taken along line B-B' of FIG. 8 according to an embodiment of the present disclosure.

FIG. 13 is a cross-sectional view of the display panel 100 taken along line B-B' of FIG. 8 according to an embodiment of the present disclosure.

Figure 14:
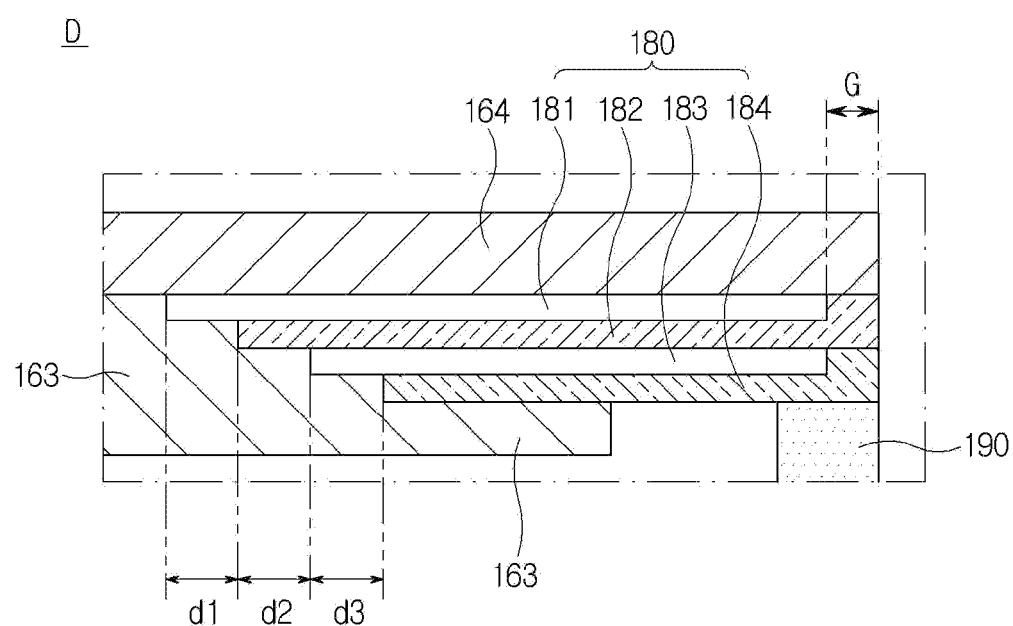
FIGS. 14 to 16 are enlarged views of area D of FIG. 13 according to one or more embodiments of the present disclosure.
Figure 15:
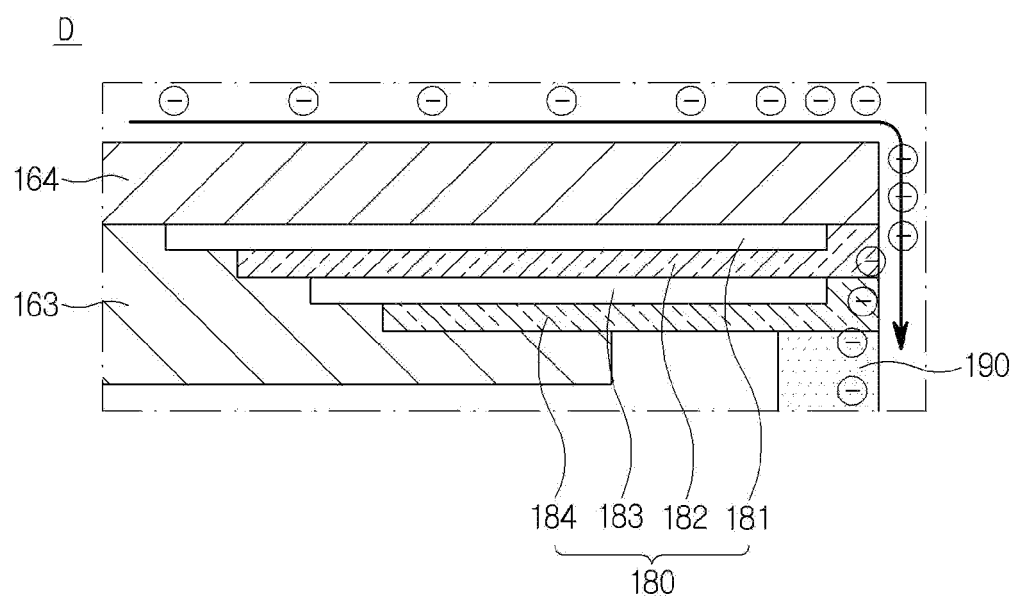
Figure 16:
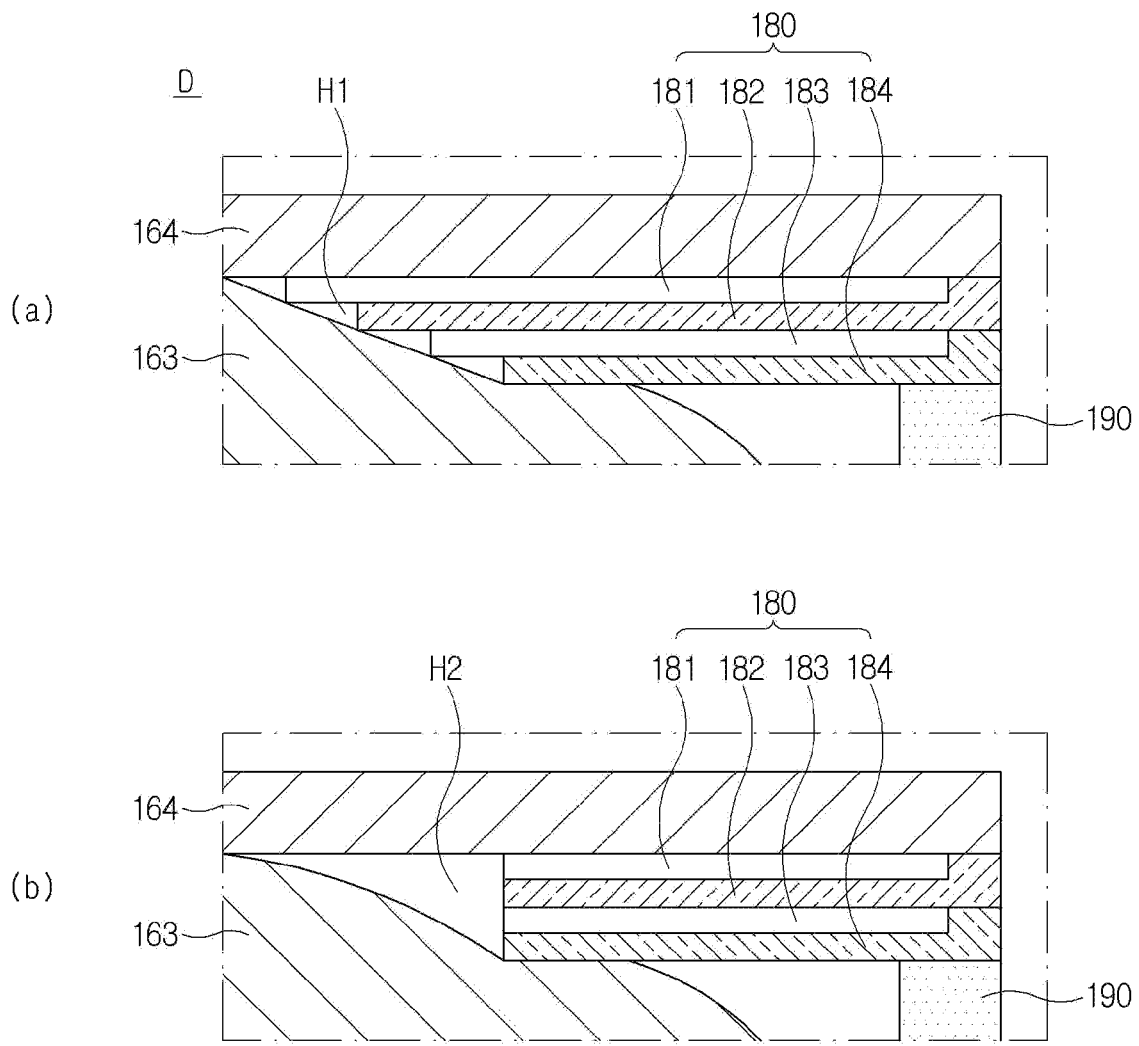

FIGS. 14 to 16 are enlarged views of area D of FIG. 13 according to an embodiment of the present disclosure.

In FIGS. 13 to 16, a features referred to with the same reference numeral as described above are the same features with the same function, therefore description of redundant features will be omitted.

As explained above, FIG. 13 is a cross-sectional view of the peripheral edge (NPE) of the display panel 100 that is not in contact with the pad area (PA).

Referring to FIG. 13, the display panel 100 may include the cover window 164 which is the uppermost layer, the adhesive layer 163 disposed below the cover window 164, the polarizer 162 disposed below the adhesive layer 163 and the panel layer 110 disposed below the polarizer 162.

The cover window 164 is disposed as an uppermost layer of the display panel 100 and may be formed of glass or plastic. If friction occurs on the cover window, an electric charge occurs by the friction and may transfer along a side of the cover window and penetrate into the inside of the display panel in a conventional display device.

The adhesive layer 163 may be disposed below the cover window 164 and may be of a flexible material such as an OCA or PSA.

The polarizer 162 may be formed of a film having a feature of polarization.

The panel layer 110 may be a layer where pixels are formed and transistors and the like are formed inside. If a frictional charge penetrates into the inside of the panel layer in a conventional device, the shift phenomenon may occur in the transistor and a screen quality deterioration may occur due to the green phenomenon described herein.

The first backplate 101a may be a firm structure disposed below the panel layer 110.

The support member 170 may include the adhesive 171, the cushion tape 172, and the heat dissipation sheet 173. Particularly, the heat dissipation sheet 173 may be formed of a metal material such as copper in order to dissipate heat. Also, the heat dissipation sheet 173 may serve as a ground that discharges the electric charge transferred along the travel path formed by the antistatic solution in some prior solutions.

The black matrix 167 may be formed in some areas on the panel layer 110.

According to one or more embodiments of the present disclosure, the ink layer 180 may be formed on the rear surface 164R of the cover window 164. The ink layer 180 may be configured as a multi-layer structure and may be adhered directly to the middle frame 190. In addition, the ink layer 180 may overlap with the adhesive layer 163. For example, the ink layer 180 with a multi-layer structure may be formed on the rear surface 164R of the cover window 164, and the adhesive layer 163 may be formed on the rear surface 164R of the cover window 164. The adhesive layer 163 is a flexible material such as an OCA or PSA and may contact with some part of the ink layer 180 while the adhesive layer 163 is formed. One of the layers consisting the ink layer 180 may include a conductive material.

The middle frame 190 may include the vertical portion 191 and the horizontal portion 192. The middle frame 190 may form an appearance of the display panel 100. The middle frame 190 preferably has rigidity and may be formed of a metal material. The middle frame 190 may include the vertical portion 191 extending vertically and the horizontal portion 192 extending horizontally. The middle frame 190 may be adhered directly to the ink layer 180. As illustrated in FIG. 13, the vertical portion 191 of the middle frame 190 may be directly adhered to the ink layer 180. Such a middle frame 190 may be, as described below, configured to provide a travel path for an electric charge, generated by friction and the like on a top surface of the cover window 164, to be discharged.

With reference to FIG. 14, a detailed structure of the ink layer 180 according to embodiments of the disclosure will be explained.

For example, the ink layer 180 may include four layers. Particularly, the first layer 181 adhered to the rear surface of the cover window 164 may be formed in a way where one end thereof is spaced apart by a gap (G) from an end of the cover window 164. The second layer 182 may be a layer formed below the first layer 181. The second layer 182 may not be spaced apart by the gap (G) from an end of the cover window 164. Accordingly, one end of the second layer 182 may be formed to penetrate into the gap (G) formed between an end of the first layer 181 and an end of the cover window 164. Thus, one end of the second layer 182 may contact with a rear surface of the cover window 164. The third layer 183 may be a layer formed below the second layer 182. The third layer 183 may be formed to be spaced apart by the gap (G) from the end of the cover window 164. The fourth layer 184 may be a layer formed below the third layer 183. The fourth layer 184 may not be spaced apart by the gap (G) from an end of the cover window 164. Accordingly, one end of the fourth layer 184 may be formed to penetrate into the gap (G) formed between an end of the third layer 183 and an end of the cover window 164. Therefore, the end of the fourth layer 184 may contact with a rear surface of the second layer 182. For example, the gap (G) may be 0.5 mm. The display panel 100 according to one or more embodiments in this structure may form a travel path of the electric charge similar to that described above. Description thereof will be provided later on with reference to FIG. 15.

For example, the first layer 181 may have a height of 4 μm. The second layer 182 may have a height of 4 um. A height of the part that the second layer 182 penetrates into the first layer 181 may be 8 μm. The third layer 183 may have a height of 4 μm. The fourth layer 184 may have a height of 4 um. A height of the part that the fourth layer 184 penetrates into the third layer 183 may be 8 um. As a result, the overall height of the ink layer 180 may be 16 um.

In addition, another end of the first layer 181 may protrude further inward than another end of the second layer 182. Here, the term "inward" refers to a direction towards a center of the display panel 100 and refers to a direction toward line A in FIG. 10. For example, another end of the first layer 181 may protrude further by d1 than another end of the second layer 182. Another end of the second layer 182 may protrude further inward than another end of the third layer 183. For example, another end of the second layer 182 may protrude further inward by d2 than another end of the third layer 183. Another end of the third layer 183 may protrude further inward than another end of the fourth layer 184. For example, another end of the third layer 183 may protrude further inward than another end of the fourth layer 184 by d3. For example, a length of each of d1 to d3 may be 0.4 mm. Such a structure may prevent delamination of the adhesive layer 163 and this will be explained later on with reference to FIG. 16.

With reference to FIG. 15, the travel path of an electric charge according to embodiments of the disclosure will be described.

According to at least some embodiments, the second layer 182 and the fourth layer 184 may include a conductive material. The conductive material may include conductive balls or conductive wires. For example, each layer 181, 182, 183, 184 of the ink layer 180 may be formed of one or more materials among acrylic resin, epoxy resin, phenol resin, polyamide resin, and benzocyclobutene. A conductive ball included in each layer 181, 182, 183, 184 may be a conductive ball on which a conductive film is formed by pre-treating the ball formed of a polymer-based material and sputtering on the outer shell of the polymer ball. The conductive wire may be a silver nano wire formed of silver (Ag). The conductive wire is divided into a conductive section and an insulator section and conductive wires are irregularly disposed through the conductive section. The conductive ball or conductive wire are examples that can make each of the ink layers 181, 182, 183, 184 have conductivity, and another type of a conductive layer having conductivity may be used.

For example, if the second layer 182 or the fourth layer 184 include the conductive ball, it is preferable to form the conductive ball at a ratio of 20% to 30%. Further, each of the conductive balls have a diameter of 10 μm. In addition, each of the conductive balls may have a blue series color. Each of the conductive balls may have a surface resistance of 104 to 109 Ohm/sq.

For example, if the second layer 182 or the fourth layer 184 have the conductive wire, it is preferable to form the conductive wires at a ratio of 10% to 20%. Also, each of the conductive wires may be 25 um long and may have a diameter of 25 nm. In addition, each of the conductive wires may have a gray series color. Each of the conductive wires may have a surface resistance of 20 to 80 ohm/sq.

Referring to the travel path of the electric charge illustrated in FIG. 15, the electric charge may be generated on a top surface of the cover window 164. Since the cover window 164 is the surface exposed to the outside, the electric charge may be generated by a touch of a user and the like. The electric charge moves in a bottom direction along the outer surface of the cover window 164, and if the electric charge moves to the display panel 100, more particularly, to the inside of the panel layer 110, the transistor provided in the inside of panel layer 110 may be shifted, and that will lead to screen quality deterioration due to the green phenomenon. Prior art selected a method to form a travel path of the electric charge by applying an antistatic solution on sides of the adhesive layer, polarizer, panel layer and the like towards the heat dissipation sheet to discharge the electric charges. Such a method had problems in that the antistatic solution may not be properly applied and the applied antistatic solution may be removed after application is done.

According to at least one embodiment, by directly adhering the ink layer 180 having conductivity and the middle frame 190 including a metal material, an electric charge may move through the ink layer 180 to the middle frame 190. The transferred electric charge may be discharged through the middle frame 190. Particularly, the second layer 182 is formed to penetrate into the first layer 181 and may include a conductive material. Also, the fourth layer 184 is formed to penetrate into the third layer 183 and may include a conductive material. By the penetration, the fourth layer 184 becomes to contact with the second layer 182. Therefore, on a rear surface of the cover window 164, the travel path of the electric charge along the second layer 182, fourth layer 184 and the middle frame 190 may be formed.

With reference to FIG. 16, improvement on delamination of the adhesive layer 163 according to the embodiments of the disclosure will be explained.

The drawing (a) of FIG. 16 is a detail view of area D of FIG. 13 according to one or more embodiments, and the drawing (b) of FIG. 16 shows a cross section according to a comparative example.

Referring to the drawing (a) of FIG. 16, as explained above, each layer of the ink layer 180 may protrude further inward compared with layers disposed at a lower portion. Particularly, the first layer 181 may protrude further than the second layer 182 by d1, the second layer 182 may protrude further than the third layer 183 by d2, and the third layer 183 may protrude further than the fourth layer 184 by d3 (FIG. 14). In comparison, thanks to the structure of sequential protrusion, the ink layer 180 may have an inclined structure. With reference to the drawing (b) of FIG. 16, a protruding degree of each of the ink layer 180 is the same compared with other layers disposed below. In a drawing (b) of FIG. 16, the ink layer 180 does not have an inclined structure. The adhesive layer 163 is an OCA or PSA and may be of a flexible material. Therefore, if contacting the cover window 164 where the ink layer 180 is formed on a rear surface thereof with the adhesive layer 163, the adhesive layer 163 may be elevated and may cover some part of the ink layer 180. Thereafter, during when the adhesive layer 163 is being cured, the adhesive layer 163 shrinks and moves inward by a certain distance. In this case, between the cover window 164 and the adhesive layer 163, spaces H1, H2 may be formed. If the spaces H1, H2 are formed large, the adhesive layer 163 may be easily delaminated from the cover window 164. The space H1 in the drawing (a) of FIG. 16 is smaller than the space H2 in the drawing (b) of FIG. 16. That is, according to the embodiments of the disclosure, it is possible to minimize the space H1 formed between the cover window 164 and the adhesive layer 163. Therefore, the structure according to one or more embodiments may improve the problem of delamination between the cover window 164 and the adhesive layer 163.

Figure 17:
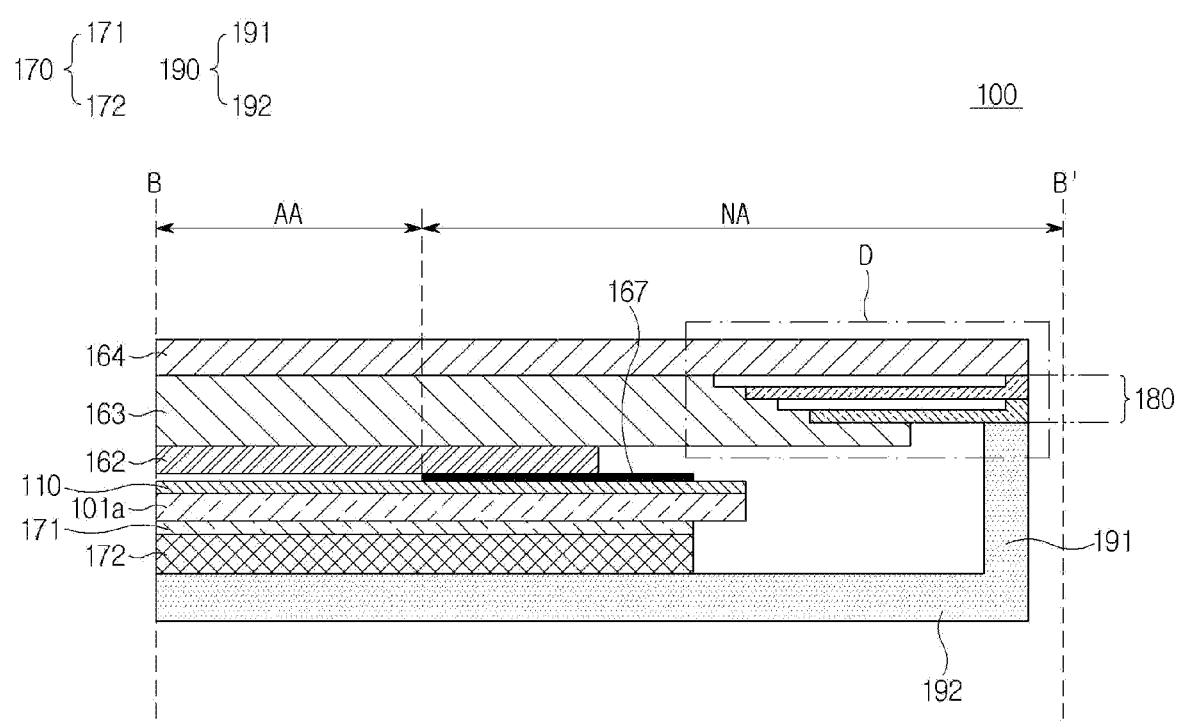
FIG. 17 is a cross-sectional view of the display panel of FIG. 8 taken along line B-B' of FIG. 8 according to an embodiment of the present disclosure.

FIG. 17 is a cross-sectional view of the display panel 100 taken along line B-B' direction of FIG. 8 according to one or more embodiments of the present disclosure.

The embodiments implemented in FIG. 17 may be embodiments where the heat dissipation sheet 173 is omitted compared with the one or more embodiments implemented in FIG. 13. Therefore, when describing FIG. 17, a configuration referred to with the same reference numeral that has been described above are similar configurations with the same function, therefore description of the redundant configurations will be omitted.

According to some embodiments, the panel layer 110 may be disposed below the adhesive layer 163 in the peripheral edge (NPE) that is not in contact with the pad area (PA). Below the panel layer 110, the adhesive 171 and the cushion tape 172 may be sequentially formed.

The cushion tape 172 may be adhered to the middle frame 190. More specifically, the cushion tape 172 may be adhered to the horizontal portion 192 of the middle frame 190.

In FIG. 17, the support member 170 does not include a heat dissipation sheet. As explained above, at least one layer of the multi-layer structure of the ink layer 180 may be include a conductive material. In addition, the ink layer 180 may be directly adhered to the middle frame 190, which may also include a metal material. Therefore, the electric charge generated on a top surface of the cover window 164 may move along the travel path formed in the conductive ink layer 180 and the middle frame 190. The heat dissipation sheet 173 that is omitted in at least some embodiments may serve to discharge the electric charge as in the one or more embodiments of FIG. 13. However, in FIG. 17, since the middle frame 190 serves to discharge the electric charge, the heat dissipation sheet 173 may be omitted. By doing so, manufacturing cost of the display panel 100 may be decreased, and the thickness and the weight of the display panel 100 may be decreased.

Figure 18:
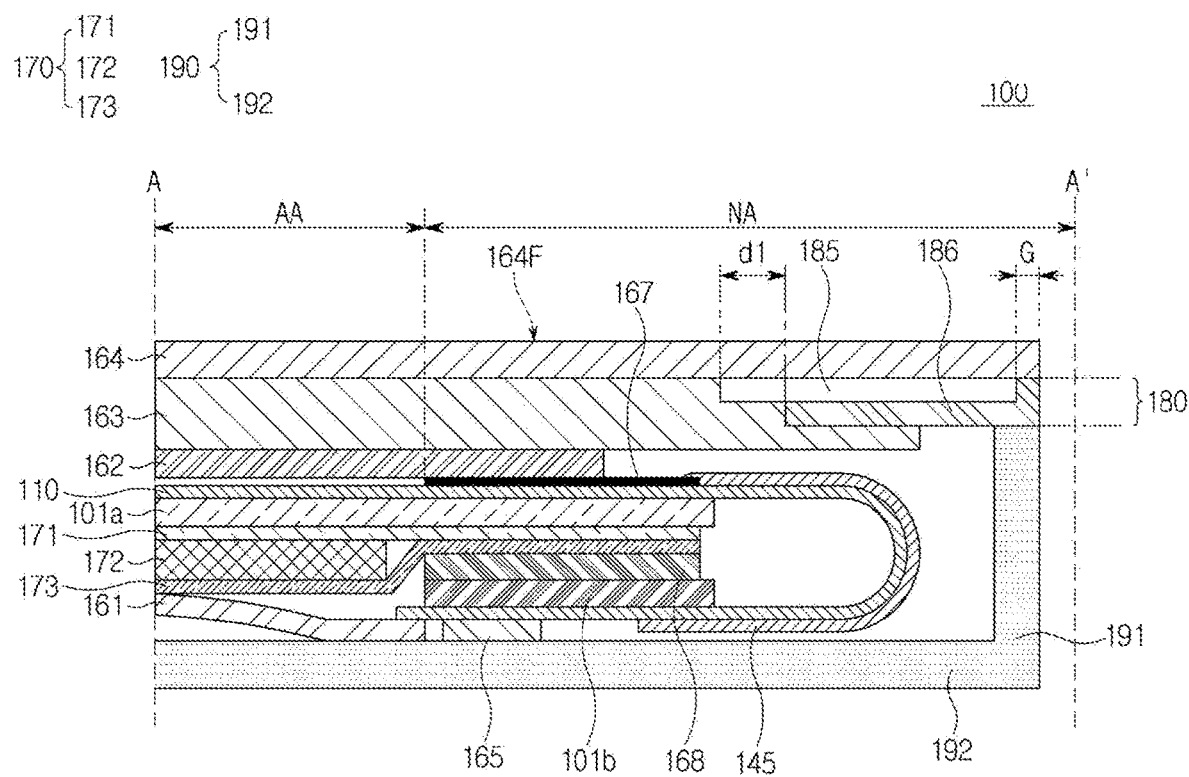
FIG. 18 is a cross-sectional view of the display panel of FIG. 8 taken along line A-A' of FIG. 8 according to an embodiment of the present disclosure.

FIG. 18 is a cross-sectional view of the display panel 100 taken along line A-A' of FIG. 8 according to one or more embodiments of the present disclosure.

Figure 19:
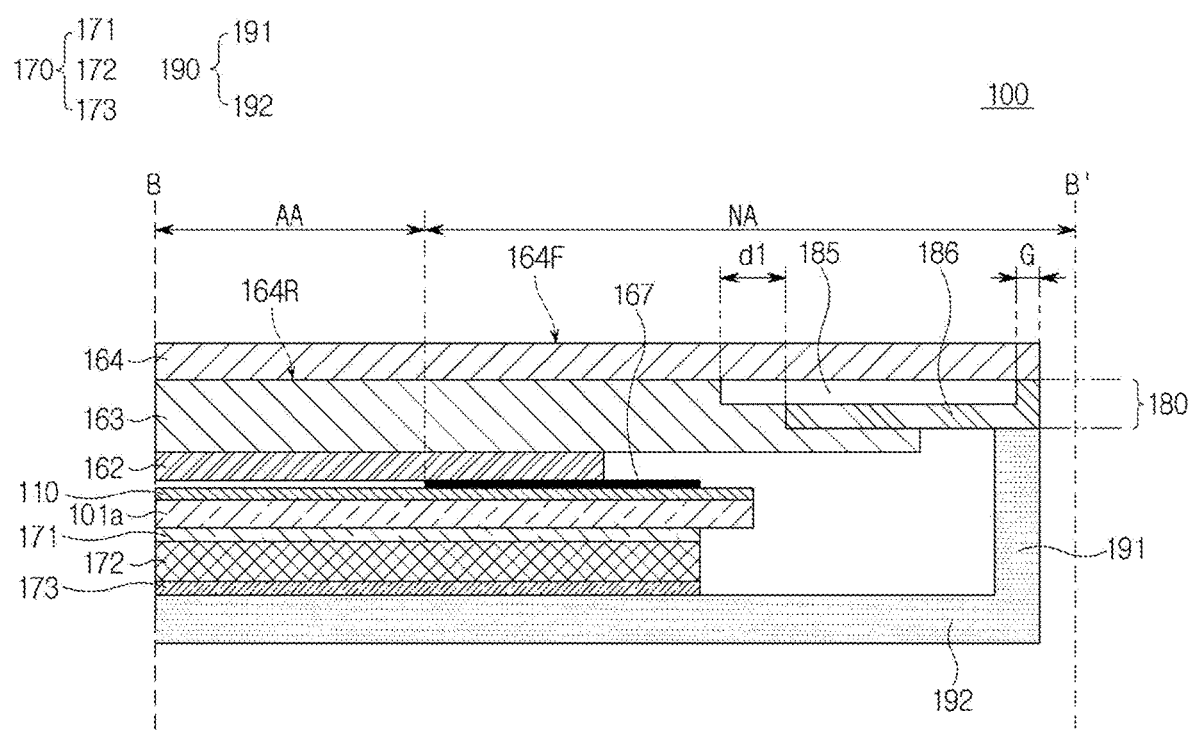
FIG. 19 is a cross-sectional view of the display panel of FIG. 8 taken along line B-B' of FIG. 8 according to an embodiment of the present disclosure.

FIG. 19 is a cross-sectional view of the display panel 100 taken along line B-B' of FIG. 8 according to one or more embodiments of the present disclosure.

With reference to FIGS. 18 and 19, the display panel 100 according to at least some embodiments will be explained.

In the embodiment explained with reference to FIGS. 9 to 13, the ink layer 180 includes four layers 181, 182, 183, 184, however the present disclosure contemplates a display panel 100 with less than four layers. For example, the ink layer 180 of the display panel 100 of FIG. 18 and FIG. 19 may include only two layers 185, 186. Hereinafter, description of configurations referred with the same reference numerals will be omitted.

With reference to FIGS. 18 and 19, the ink layer 180 may include the first layer 185 and the second layer 186. The first layer 185 may be disposed on the rear surface 164R of the cover window 164. The first layer 185 may be formed with one end thereof, such as a right end, spaced apart by a gap (G) from an end or outer edge of the cover window 164. The second layer may be disposed below the first layer 185. One end of the second layer 186 may be formed to penetrate into the gap (G) and extend across a height or thickness of the first layer 185 to contact the rear surface 164R of the cover window 164. Accordingly, the second layer 186 may be in direct contact with the cover window 164.

In addition, the second layer 186 may include a conductive material. For example, the conductive material may be a conductive ball or a conductive wire. The middle frame 190 may include a metal material. Therefore, an electric charge generated by friction and the like upon the front or top surface 164F of the cover window 164 may move along a travel path formed in the ink layer 180 and the middle frame 190 and then be discharged.

Further, another end of the first layer 185 may protrude inward further compared with the second layer 186. Here, the term "inward" refers to a direction towards a center of the display panel 100 and refers to a direction toward the line A in FIG. 18 or a direction toward the line B in FIG. 19. Such a protrusion structure reduces a space that may be formed between the adhesive layer 163 and the cover window 164. Therefore, the delamination phenomenon where the adhesive layer 163 delaminates from the cover window 164 may be reduced, as described herein.

The display device according to the embodiment of the present disclosure may include a complete product or final product that includes LCM, OLED module and the like such as a laptop, television and a computer monitor, an automotive display apparatus or an equipment display apparatus for other types of vehicles, and a set electronic device apparatus, or a set device or a set apparatus such as a mobile electronic device apparatus including a smartphone or mobile tablets.

The display device according to one or more embodiments of the present disclosure as explained above may be summarized again briefly as below. According to one or more embodiments, a display panel may include: a cover window; an ink layer formed with a multi-layer structure on a rear surface of the cover window and directly adhered to a middle frame; and an adhesive layer disposed on the rear surface of the cover window and overlapping with the ink layer, and at least one layer of the ink layer may include a conductive material.

the middle frame may include a metal material, and an electric charge generated on the cover window may be discharged to the middle frame through the ink layer.

The ink layer may include: a first layer of which one end is spaced apart by a gap from one end of the cover window; a second layer disposed below the first layer and having one end penetrating into the gap and contacting with the cover window; a third layer disposed below the second layer and having one end spaced apart by the gap; and a fourth layer disposed below the third layer and having one end penetrating into the gap and contacting with the second layer.

Another end of the first layer may protrude inward further than another end of the second layer.

Another end of the second layer may protrude inward further than another end of the third layer.

Another end of the third layer may protrude inward further than another end of the fourth layer.

The second layer and the fourth layer may include a conductive material.

The conductive material may include conductive balls.

The conductive balls may be formed at a ratio of 20% to 30%.

The conductive material may include conductive wires.

The conductive wires may be characterized in being silver nanowires.

The conductive wires may be formed at a ratio of 10% to 20%.

The middle frame may include a metal material, and an electric charge formed in the cover window may be discharged to the middle frame through the second layer and the fourth layer.

The display panel may include a pad area where pads are formed, and at a pad edge where the pad area is in contact, the display panel may include: a panel layer disposed below the adhesive layer; a circuit element and a driver IC disposed below the panel layer; and an adhesive, a cushion tape and a heat dissipation sheet sequentially disposed below the panel layer.

The display panel may include a pad area where pads are formed, and at a peripheral edge where the pad area is not in contact, the display panel may further include: a panel layer disposed below the adhesive layer; an adhesive, a cushion tape and a heat dissipation sheet sequentially disposed below the panel layer, and the heat dissipation sheet may be adhered to the middle frame.

The display panel may include a pad area where pads are formed, and at a peripheral edge where the pad area is not in contact, the display panel may further include: a panel layer disposed below the adhesive layer; an adhesive and a cushion tape sequentially disposed below the panel layer, and the cushion tape may be adhered to the middle frame.

The ink layer may include: a first layer of which one end is spaced apart by a gap from an end of the cover window, and a second layer disposed below the first layer and having one end penetrating into the gap and contacting with the cover window.

The second layer may include a conductive material.

The middle frame may include a metal material.

An electric charge generated in the cover window may be discharged to the middle frame through the second layer.

Another end of the first layer may protrude inward further than another end of the second layer.

The conductive material may include at least one among conductive balls or conductive wires.

Those skilled in the art would understand that the technical configurations of the present disclosure described herein may be implemented in other concrete forms without modifying the technical concept or essential features thereof. Thus, it should be understood that embodiments described hereinabove are examples in all aspects, and do not limit the present disclosure. The scope of the present disclosure should be construed to include all modifications or variations that are derived from the meaning, scope and the concept of equivalence of the present disclosure and the following claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel, comprising:
a cover window;
an ink layer on a rear surface of the cover window, the ink layer having a multi-layer structure;
a middle frame directly coupled to the ink layer; and
an adhesive layer disposed on the rear surface of the cover window and overlapping the ink layer,
wherein at least one layer of the multi-layer structure of the ink layer includes a conductive material,
wherein the multi-layer structure of the ink layer further includes:
a first layer having one end spaced apart by a gap from an end of the cover window; and
a second layer disposed below the first layer, the second layer having one end penetrating into the gap and contacting the cover window.

2. The display panel of claim 1, wherein the middle frame includes a metal material, and wherein the cover window is configured to generate an electric charge that is discharged to the middle frame through the ink layer.

3. The display panel of claim 1, wherein the multi-layer structure of the ink layer further includes:
a third layer disposed below the second layer, the third layer having one end spaced apart from the cover window by the gap; and
a fourth layer disposed below the third layer, the fourth layer having one end penetrating into the gap and contacting the second layer.

4. The display panel of claim 1, further comprising:
a pad area including a plurality of pads, wherein, at a pad edge of the display panel in contact with the pad area, the display panel further comprises:
a panel layer disposed below the adhesive layer;
a circuit element and a driver IC disposed below the panel layer; and
an adhesive, a cushion tape, and a heat dissipation sheet sequentially disposed below the panel layer.

5. The display panel of claim 1, further comprising:
a pad area including a plurality of pads, wherein, at a peripheral edge of the display panel that is not in contact with the pad area, the display panel further comprises:
a panel layer disposed below the adhesive layer;
an adhesive, a cushion tape, and a heat dissipation sheet sequentially disposed below the panel layer, and
wherein the heat dissipation sheet is coupled to the middle frame.

6. The display panel of claim 1, wherein the display panel further comprises:
a pad area including a plurality of pads, wherein, at a peripheral edge of the display panel that is not in contact with the pad area, the display panel further comprises:
a panel layer disposed below the adhesive layer;
an adhesive and a cushion tape sequentially disposed below the panel layer, and
wherein the cushion tape is coupled to the middle frame.

7. The display panel of claim 1, wherein the second layer includes a conductive material.

8. The display panel of claim 1, wherein another end of the first layer protrudes further inward relative to the cover window than another end of the second layer.

9. The display panel of claim 3, wherein another end of the first layer protrudes further inward relative to the cover window than another end of the second layer.

10. The display panel of claim 3, wherein another end of the second layer protrudes further inward relative to the cover window than another end of the third layer.

11. The display panel of claim 3, wherein another end of the third layer protrudes further inward relative to the cover window than another end of the fourth layer.

12. The display panel of claim 3, wherein the second layer and the fourth layer include a conductive material.

13. The display panel of claim 7, wherein the middle frame includes a metal material, and wherein the cover window is configured to generate an electric charge that is discharged to the middle frame through the second layer.

14. The display panel of claim 7, wherein the conductive material includes at least one of conductive balls and conductive wires.

15. The display panel of claim 12, wherein the conductive material includes conductive balls.

16. The display panel of claim 12, wherein the conductive material includes conductive wires.

17. The display panel of claim 12, wherein the middle frame includes a metal material, and wherein the cover window is configured to generate an electric charge that is discharged to the middle frame through the second layer and the fourth layer of the ink layer.

18. The display panel of claim 15, wherein each of the second layer and the fourth layer include the conductive balls in a ratio between and including 20% to 30% by volume.

19. The display panel of claim 16, wherein the conductive wires are silver nanowires.

20. The display panel of claim 16, wherein each of the second layer and the fourth layer include the conductive wires in a ratio between and including 10% to 20% by volume.

21. A display panel, comprising:
a cover window;
an ink layer on a rear surface of the cover window, the ink layer including a plurality of individual layers;
a conductive layer positioned as one layer of the plurality of individual layers of the ink layer;
a frame member directly connected to the ink layer;
an adhesive layer disposed on the rear surface of the cover window and overlapping the ink layer;
a panel layer disposed below the adhesive layer; and
a cushion tape disposed below the panel layer.

22. The display panel of claim 21, wherein a first layer of the plurality of individual layers is spaced from the cover window by a gap, and a second layer of the plurality of individual layers extends through the gap and is in contact with the cover window.

23. A display panel, comprising:
a cover window;
an ink layer on a rear surface of the cover window, the ink layer having a multi-layer structure;
a middle frame directly coupled to the ink layer; and
an adhesive layer disposed on the rear surface of the cover window and overlapping the ink layer, wherein at least one layer of the multi-layer structure of the ink layer includes a conductive material,
wherein the multi-layer structure of the ink layer further includes:
a first layer having one end spaced apart by a gap from an end of the cover window; and
a second layer disposed below the first layer, the second layer having one end penetrating into the gap and contacting the cover window, and
wherein another end of the first layer protrudes further inward relative to the cover window than another end of the second layer.

24. The display panel of claim 23, wherein the middle frame is in direct contact with a rear surface of the ink layer, and
wherein the ink layer is disposed between the cover window and the middle frame.

* * * * *